(12) United States Patent
Lim et al.

(10) Patent No.: US 12,340,868 B2
(45) Date of Patent: Jun. 24, 2025

(54) SEMICONDUCTOR DEVICE AND METHOD FOR PREFORMING EMPHASIS DRIVING

(71) Applicant: SAMSUNG ELECTRONICS CO., LTD., Suwon-si (KR)

(72) Inventors: Baek Jin Lim, Suwon-si (KR); Youngchul Cho, Suwon-si (KR); Seungjin Park, Suwon-si (KR); Doobock Lee, Suwon-si (KR); Youngdon Choi, Suwon-si (KR); Junghwan Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 125 days.

(21) Appl. No.: 18/046,030

(22) Filed: Oct. 12, 2022

(65) Prior Publication Data

US 2023/0170003 A1    Jun. 1, 2023

(30) Foreign Application Priority Data

Nov. 26, 2021  (KR) .................. 10-2021-0165802
Apr. 20, 2022  (KR) .................. 10-2022-0049003

(51) Int. Cl.
*G11C 7/10* (2006.01)
*G11C 7/04* (2006.01)
*G11C 8/10* (2006.01)
*H03K 19/0175* (2006.01)

(52) U.S. Cl.
CPC .............. *G11C 7/1063* (2013.01); *G11C 7/04* (2013.01); *G11C 7/1036* (2013.01); *G11C 8/10* (2013.01); *H03K 19/017545* (2013.01); *G11C 2207/2254* (2013.01)

(58) Field of Classification Search
CPC ....... G11C 7/1063; G11C 7/04; G11C 7/1036; G11C 7/1057; G11C 7/4093; G11C 7/1048; G11C 7/1051; G11C 8/10; G11C 2207/2254; G11C 29/50008; G11C 29/022; G11C 29/028; H03K 19/017545; H03K 19/0005
See application file for complete search history.

(56) References Cited

U.S. PATENT DOCUMENTS

| | | |
|---|---|---|
| 7,545,164 B2 | 6/2009 | Song et al. |
| 8,581,620 B2 | 11/2013 | Kim |
| 9,337,807 B2 | 5/2016 | Hollis et al. |
| 9,998,121 B2 | 6/2018 | Choi |

(Continued)

FOREIGN PATENT DOCUMENTS

| | | |
|---|---|---|
| KR | 10-2011-0107995 A | 10/2011 |
| KR | 10-2012-0004730 A | 1/2012 |

*Primary Examiner* — Sultana Begum
(74) *Attorney, Agent, or Firm* — Sughrue Mion, PLLC

(57) ABSTRACT

There is provided a semiconductor device, which includes a calibration code generator circuit configured to generate a calibration code according to changes in external conditions, a first driver circuit configured to output a data signal with an impedance value controlled by the calibration code, an emphasis control circuit configured to generate an emphasis data signal using the data signal, and to change the calibration code according to an operating frequency to generate an emphasis code; and a second driver circuit configured to output the emphasis data signal with an impedance value controlled by the emphasis code.

13 Claims, 30 Drawing Sheets

(56) References Cited

U.S. PATENT DOCUMENTS

| | | |
|---|---|---|
| 10,778,220 B2 | 9/2020 | Hwang et al. |
| 2013/0049823 A1* | 2/2013 | Iwasaki .......... H03K 19/018571 |
| | | 327/124 |
| 2016/0149578 A1* | 5/2016 | Lee ................ H03K 19/018514 |
| | | 327/108 |
| 2016/0301393 A1* | 10/2016 | Jung .............. H03K 19/018521 |
| 2022/0310135 A1* | 9/2022 | Hwang ............ H03K 19/01742 |

* cited by examiner

| MS0/MS1 | a6 | a5 | a4 | a3 | a2 | a1 | a0 |
|---|---|---|---|---|---|---|---|
| 0 (bypass) | a6 | a5 | a4 | a3 | a2 | a1 | a0 |
| 1 (shift) | 0 | a6 | a5 | a4 | a3 | a2 | a1 |

SEMICONDUCTOR DEVICE AND METHOD FOR PREFORMING EMPHASIS DRIVING

CROSS-REFERENCE TO RELATED APPLICATION

This application is based on and claims priority to Korean Patent Application No. 10-2021-0165802 filed in the Korean Intellectual Property Office on Nov. 26, 2021, and Korean Patent Application No. 10-2022-0049003 filed in the Korean Intellectual Property Office on Apr. 20, 2022, the entire contents of which are incorporated herein by reference.

BACKGROUND

1. Field

The disclosure relates to semiconductor devices.

2. Description of Related Art

A semiconductor memory device is connected to a memory controller through a transmission line. When a data signal is transmitted through a transmission line, a transmission characteristic according to the frequency of the transmission line has a characteristic of a low pass filter (LPF), so a data signal of a high frequency data rate may be attenuated.

In order to compensate for the attenuated high-frequency component, a pre-emphasis scheme for boosting the gain of the high-frequency component and a de-emphasis scheme for reducing the gain of the low-frequency component are used.

SUMMARY

According to an aspect of the disclosure, there is provided a semiconductor device capable of changing the driving strength of the emphasis driving (i.e., the pre-emphasis scheme and the de-emphasis scheme) in response to PVT (Process, Voltage, Temperature) fluctuations.

According to an aspect of the disclosure, there is provided a semiconductor device capable of changing the driving strength and duration of the emphasis driving according to the change in the operating frequency.

According to an aspect of the disclosure, there is provided a semiconductor device including: a calibration code generator circuit configured to generate a calibration code according to changes in external conditions; a first driver circuit configured to output a data signal with an impedance value based on the calibration code; an emphasis control circuit configured to: generate an emphasis data signal based on the data signal, and generate an emphasis code by changing the calibration code based on an operating frequency; and a second driver circuit configured to output the emphasis data signal with an impedance value generated based on the emphasis code.

The emphasis code generated according to a first operating frequency may have a smaller value than the emphasis code generated according to a second operating frequency greater than the first operating frequency.

The emphasis control circuit may be configured to generate the emphasis code by level-shifting the calibration code by a number of bits based on the operating frequency.

The number of bits level-shifted according to the first operating frequency may be equal to or greater than the number of bits level-shifted according to the second operating frequency.

The emphasis data signal may be generated by inverting the data signal and delaying the data signal by a period corresponding to the emphasis code.

The emphasis data signal may include a first emphasis data signal and a second emphasis data signal, and wherein the emphasis control circuit may be configured to: generate the first emphasis data signal to emphasize the data signal by a period corresponding to the emphasis code from a rising edge of the data signal, and generate the second emphasis data signal to emphasize the data signal by a period corresponding to the emphasis code from a falling edge of the data signal.

The emphasis data signal may be generated by inverting the data signal and delaying the data signal by a period corresponding to the calibration code.

The emphasis data signal may include a first emphasis data signal and a second emphasis data signal, and wherein the emphasis control circuit may be configured to: generate the first emphasis data signal to emphasize the data signal by a period corresponding to the calibration code from a rising edge of the data signal, and generate the second emphasis data signal to emphasize the data signal by a period corresponding to the calibration code from a falling edge of the data signal.

The second driver circuit may be configured to output the emphasis data signal with an impedance value adjusted by the calibration code under the control of the emphasis control circuit.

The semiconductor device may further include a third driver circuit configured to output the emphasis data signal with an impedance value adjusted by the emphasis code, wherein the emphasis control circuit may be configured to control the third driver circuit to operate according to the operating frequency.

According to another aspect of the disclosure, there is provided a semiconductor memory device including: a memory cell array including a plurality of memory cells; a decoder configured to determine frequency information based on a command signal; a calibration circuit configured to: generate a calibration code using an external ZQ resistor connected to the calibration circuit, and generate an emphasis code based on the calibration code and the frequency information; and a data output circuit configured to output data read from the memory cell array by reflecting a signal level of the output data based on the emphasis code.

A signal magnitude according to the emphasis code based on a first operating frequency may be smaller than a signal magnitude according to the emphasis code based on a second operating frequency greater than the first operating frequency.

The data output circuit may be configured to emphasize and output the data by a signal level according to the emphasis code.

The data output circuit may be configured to emphasize and output the data for a period according to the emphasis code from a time when the data transitions.

The data output circuit may be configured to reduce the data by a signal level according to the emphasis code and output the reduced data.

The data output circuit may be configured to decrement and output the data after a period according to the emphasis code has elapsed from a time when the data transitions.

The calibration circuit may include a mode selector configured to set an operating mode corresponding to the frequency information; and an emphasis code generator configured to generate the emphasis code by level-shifting the calibration code with a number of bits according to the operation mode.

The number of bits level-shifted in the operation mode corresponding to a first operation frequency may be equal to or greater than the number of bits level-shifted in the operation mode corresponding to a second operation frequency greater than the first operation frequency.

The emphasis code may have a smaller value than the calibration code.

According to another aspect of the disclosure, there is provided a transmitter including: a first driver circuit connected to a transmission line configured to output data, the first driver circuit including a plurality of first pull-up transistors and a plurality of first pull-down transistors; a calibration code generator circuit configured to generate a calibration code for selectively operating the plurality of first pull-up transistors and the plurality of first pull-down transistors based on an external change; a second driver circuit connected to the transmission line, and the second driver circuit including a plurality of second pull-up transistors and a plurality of second pull-down transistors; and an emphasis code generator circuit configured to generate an emphasis code for selectively operating the plurality of second pull-up transistors and the plurality of second pull-down transistors based on a change in frequency.

According to another aspect of the disclosure, there is provided a semiconductor memory device including: a memory cell array including a plurality of memory cells; a calibration circuit configured to generate an emphasis code by using external ZQ resistance connected to the calibration circuit and operating frequency information; a control circuit configured to generate emphasis data by delaying data read from the memory cell array based on the emphasis code; and a data output circuit configured to combine and output the data and the emphasis data.

According to another aspect of the disclosure, there is provided a semiconductor device including: a control circuit configured to generate a delayed data signal by delaying a data signal according to an operating frequency, and a data output circuit configured to combine and output the data signal and the delayed data signal.

DETAILED DESCRIPTION OF EMBODIMENTS

Figure 1:
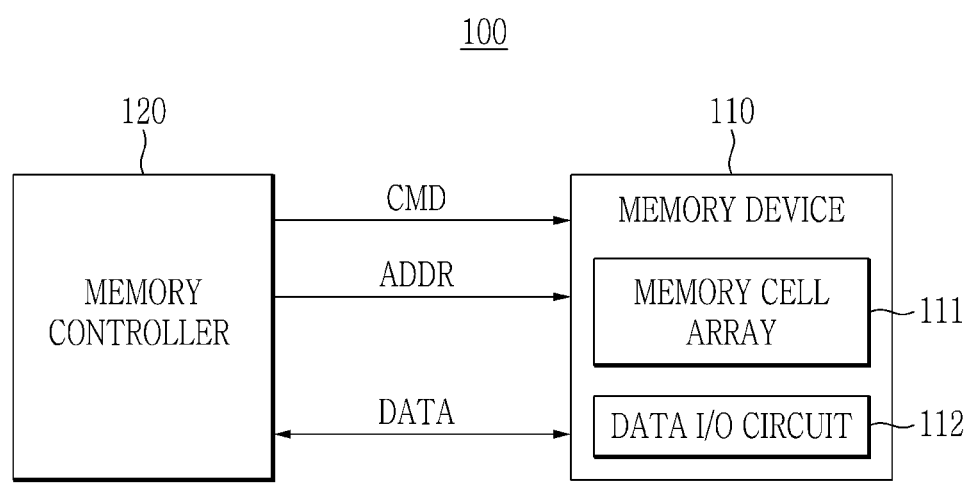
FIG. 1 is an example block diagram of a memory system according to an example embodiment.

In the following detailed description, only certain embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification. In flowcharts described with reference to the drawings, the order of operations or steps may be changed, several operations or steps may be merged, a certain operation or step may be divided, and a specific operation or step may not be performed. In the description, expressions described in the singular in this specification may be interpreted as the singular or plural unless an explicit expression such as "one" or "single" is used. An expression such as "first" and "second" indicate various constituent elements regardless of order and/or importance, is used for distinguishing a constituent element from another constituent element, and does not limit corresponding constituent elements. For example, a first constituent element may be referred to as a second constituent element without deviating from the scope described in the present specification, and similarly, a second constituent element may be referred to as a first constituent element.

FIG. 1 is an example block diagram of a memory system according to an example embodiment.

Referring to FIG. 1, a memory system 100 includes a memory device 110 and a memory controller 120. According to some example embodiments, the memory device 110 and the memory controller 120 may be connected through a memory interface to transmit and receive signals through the memory interface.

The memory device 110 includes a memory cell array 111 and a data input/output (I/O) circuit 112. For example, the data input/output (I/O) circuit 112 may include circuitry for data input and data output. The memory cell array 111 includes a plurality of memory cells connected to a plurality of rows and a plurality of columns. According to some example embodiments, rows may be defined by wordlines and columns may be defined by bitlines. The data I/O circuit 112 outputs the data DATA stored in the memory cell array 111 to the outside of the memory device 110 (e.g., the memory controller 120, etc.), or may store data DATA transmitted from the outside in the memory cell array 111.

According to an example embodiment, the data I/O circuit 112 may perform a ZQ calibration. As an example, the data I/O circuit 112 may adjust the strength of the output driver circuits connected to the data signal DATA line or other signal lines (e.g., command signal CMD/address signal ADDR line, etc.) of the memory device 120 or set On-Die Termination (ODT) value by using the ZQ calibration code (hereinafter referred to as "calibration code") that changes according to the Process, Voltage, and/or Temperature (PVT) change.

In an example embodiment, the data I/O circuit 112 may perform an emphasis driving on the data signal DATA when outputting the data signal DATA.

The data I/O circuit 112 may perform the emphasis driving in a pre-emphasis method emphasizing the high-frequency component of the data signal DATA and/or in a de-emphasis method of reducing a low-frequency component of the data signal DATA. According to some example embodiments, the data I/O circuit 112 may perform an emphasis drive using a calibration code.

In an example embodiment, the data I/O circuit 112 may perform an emphasis driving based on an operating frequency of the memory device 110. At a high frequency, the channel response characteristic is low, and at a low frequency, the channel response characteristic is high. When the channel response characteristic is low, the data I/O circuit 112 may set the intensity at which the data signal DATA is emphasized to be small or the degree of decrease in the data signal DATA to be small. According to an example embodiment, in the case of pre-emphasis driving, when the channel response characteristic is low, the data I/O circuit 112 may set the intensity at which the data signal DATA is emphasized to be small. According to an example embodiment, in the case of the de-emphasis driving, when the channel response characteristic is low, the data I/O circuit 112 may set the degree of decrease in the data signal DATA to be small. Moreover, when the channel response characteristic is low, the data I/O circuit 112 may set the period during which the data signal DATA is emphasized to be short or may set the period during which the data signal DATA is reduced to be short. According to an example embodiment, in the case of pre-emphasis driving, when the channel response characteristic is low, the data I/O circuit 112 may set the period during which the data signal DATA is emphasized to be short. According to an example embodiment, in the case of the de-emphasis driving, when the channel response characteristic is low, the data I/O circuit 112 may set the period during which the data signal DATA is reduced to be short. When the channel response characteristic is high, the data I/O circuit 112 may set the intensity at which the data signal DATA is emphasized to be large or the degree of decrease in the data signal DATA to be large. According to an example embodiment, in the case of pre-emphasis driving, when the channel response characteristic is low, the data I/O circuit 112 may set the intensity at which the data signal DATA is emphasized to be large. According to an example embodiment, in the case of the de-emphasis driving, when the channel response characteristic is low, the data I/O circuit 112 may set the degree of decrease in the data signal DATA to be large. When the channel response characteristic is high, the data I/O circuit 112 may set the period during which the data signal DATA is emphasized to be long or the period during which the data signal DATA is reduced to be long. According to an example embodiment, in the case of pre-emphasis driving, when the channel response characteristic is low, the data I/O circuit 112 may set the period during which the data signal DATA is emphasized to be long. According to an example embodiment, in the case of the de-emphasis driving, when the channel response characteristic is low, the data I/O circuit 112 may set the period during which the data signal DATA is reduced to be long.

According to some example embodiments, the data I/O circuit 112 may change a period in which the data signal DATA is emphasized and/or a period in which the data signal DATA is reduced according to an operating frequency of the memory device 110. The data I/O circuit 112 may adjust the intensity in which the data signal DATA is emphasized and/or the degree in which the data signal DATA is reduced according to the operating frequency of the memory device 110. For example, the data I/O circuit 112 may perform the emphasis driving by using a code shifted from a calibration code according to an operating frequency of the memory device 110.

The memory controller 120 controls a memory operation of the memory device 110 by providing a signal to the memory device 110. The signal may include a command (CMD) and an address (ADDR). According to some example embodiments, the memory controller 120 may provide the instruction CMD and the address ADDR to the memory device 110 to access the memory cell array 111 and to control memory operations such as reading or writing. According to a reading operation, the data may be transferred from the memory cell array 111 to the memory controller 120, and the data may be transferred from the memory controller 120 to the memory cell array 111 according to a writing operation.

The instruction CMD may include an activation instruction, a reading/writing instruction, and a refresh instruction. According to some example embodiments, the instruction CMD may further include a precharge instruction. The activation instruction may be an instruction for switching a target row of the memory cell array 111 to an active state in order to write the data to or read the data from the memory cell array 111. The memory cell of the target row may be activated (e.g., driven) in response to the activation instruction. The reading/writing instruction may be an instruction for performing a reading operation or a writing operation on the target memory cell of the row converted to the active state. According to some example embodiments, the read command may be a command for activating emphasis driving. The refresh command may be a command for performing a refresh operation in the memory cell array 111.

According to some example embodiments, the memory controller 120 may be accessed to the memory device 110 according to a request from a host of the memory system 100 outside. The memory controller 120 may communicate with the host using various protocols.

The memory device 110 may be a storage device based on a semiconductor element. According to some example embodiments, the memory device 110 may include a dynamic random-access memory (DRAM) device. According to some example embodiments, the memory device 110 may include other volatile or non-volatile memory devices to which emphasis driving is applicable.

Figure 2:
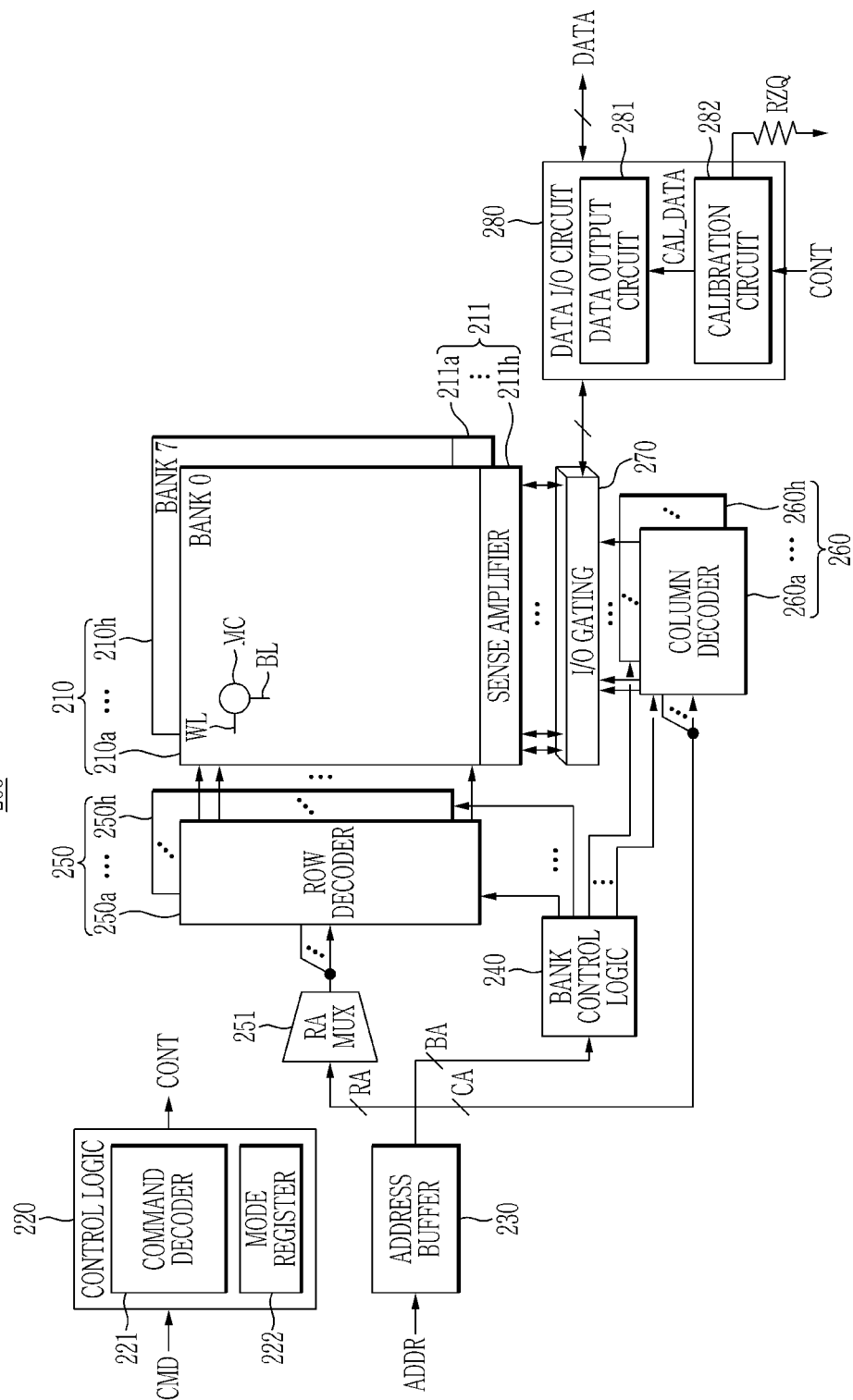
FIG. 2 is a block diagram illustrating a semiconductor memory device according to an example embodiment.

FIG. 2 is a block diagram illustrating a semiconductor memory device according to an example embodiment.

Referring to FIG. 2, the memory device 200 includes a memory cell array 210, a sense amplifier 211, a control logic circuit 220, an address buffer 230, a row decoder 250, a column decoder 260, I/O gating circuitry 270, and data I/O circuitry 280.

The memory cell array 210 includes a plurality of memory cells MC. According to some example embodiments, the memory cell array 210 may include a plurality of memory banks 210a to 210h. FIG. 2 shows eight memory banks BANK0 (210a) to BANK7 (210h), but the number of the memory banks is not limited thereto. Each of the memory banks 210a to 210h may include a plurality of rows, a plurality of columns, and a plurality of memory cells MC arranged on the intersection of a plurality of rows and a plurality of columns. According to some example embodiments, a plurality of rows may be defined by a plurality of word lines WL, and a plurality of columns may be defined by a plurality of bit lines BL.

The control logic circuit 220 controls the operation of the memory device 200. For example, the control logic circuit 220 may generate a control signal so that the memory device 200 performs a read operation, a write operation, a ZQ calibration operation, an emphasis driving, and the like. According to some example embodiments, the control logic circuit 220 may include a command decoder 221. The command decoder 221 may generate a control signal by decoding the command CMD received from the memory controller (e.g., 120 of FIG. 1). The command decoder 221 may decode the command CMD to determine frequency information (e.g., read latency, data rate, column address strobe (CAS) latency, etc.), and accordingly may generate a control signal for controlling the emphasis driving. According to some example embodiments, the control logic circuit 220 may further include a mode register 222 for setting an operation mode of the memory device 200.

The address buffer 230 receives the address ADDR provided from the memory controller 120. The address ADDR includes a row address RA indicating the row of the memory cell array 210 and a column address CA indicating the column of the memory cell array 210. The row address RA is provided to the row decoder 250, and the column address CA is provided to the column decoder 260. The row address RA may also be provided to a refresh control circuit. According to some example embodiments, the row address RA may be provided to the row decoder 250 through a row address multiplexer 251. According to some example embodiments, the address ADDR may further include a bank address BA pointing to a memory bank. The bank address BA may be provided by a bank control logic 240.

According to some example embodiments, the memory device 200 may further include a bank control logic 240 for generating a bank control signal in response to the bank address BA. In response to the bank control signal, the bank control logic 240 may activate the row decoder 250 corresponding to the bank address BA among a plurality of row decoders 250 and activate the column decoder 260 corresponding to the bank address BA among a plurality of column decoders 260.

The row decoder 250 selects a row to be activated from a plurality of rows of the memory cell array 210 based on the row address. To this end, the row decoder 250 may apply a driving voltage to the word line corresponding to the row to be activated. According to some example embodiments, a plurality of row decoders 250a to 250h corresponding to a plurality of memory banks 210a to 210h may be provided.

The column decoder 260 selects the column to be activated from among a plurality of columns of the memory cell array 210 based on the column address. To this end, the column decoder 260 may activate the sense amplifier 211 corresponding to the column address CA through the I/O gating circuit 270. According to some example embodiments, a plurality of column decoders 260a to 260h respectively corresponding to a plurality of memory banks 210a to 210h may be provided. According to some example embodiments, the I/O gating circuit 270 gates input/output data and may include a data latch for storing the data read from the memory cell array 210 and a write driver circuit for writing the data to the memory cell array 210. The data read from the memory cell array 210 may be sensed by the sense amplifier 211 and stored in an I/O gating circuit 270 (e.g., a data latch). According to some example embodiments, a plurality of sense amplifiers 211a-211h corresponding to a plurality of memory banks 210a to 210h, respectively, may be provided.

According to some example embodiments, the data read from the memory cell array 210 (e.g., the data stored in the data latch) may be provided to the memory controller 120 through the data I/O circuit 290. The data to be written into the memory cell array 210 may be provided from the memory controller 120 to the data I/O circuit 290, and the data provided to the data I/O circuit 290 may be provided to the I/O gating circuit 270.

According to some example embodiments, the data I/O circuit 280 includes a data output circuit 281 and a calibration circuit 282.

According to some example embodiments, the calibration circuit 282 generates calibration data CAL_DATA. In an example embodiment, the calibration circuit 282 may generate a calibration code using the ZQ resistor RZQ. When the termination resistor value is accurately corrected according to the calibration code generated by the calibration circuit 282, impedance matching in the memory system may be properly performed. The calibration circuit 282 may generate emphasis data according to frequency information included in the control signal CONT. The calibration circuit 282 may generate the emphasis data by delaying the data signal DATA when emphasis driving is performed. According to some example embodiments, the period during which the data signal DATA is delayed may be determined according to frequency information. The calibration circuit 282 may generate an emphasis code based on the calibration code (or by modifying the calibration code) according to frequency information included in the control signal CONT. An emphasis code generated according to the first frequency may have a smaller value than an emphasis code generated according to a second frequency that is higher than the first frequency. According to some example embodiments, the calibration circuit 282 may generate an emphasis code by level-shifting the calibration code in bits according to frequency information. For example, a bit unit according to a frequency may be determined in a range of one bit to several bit units, and the calibration code may be level-shifted in the determined bit unit. The calibration circuit 282 may generate an emphasis code by level-shifting the calibration code by the number of bits according to the frequency. The number of bits level-shifted according to the first frequency may be equal to or greater than the number of bits level-shifted according to the second frequency. According to some example embodiments, the calibration circuit 282 may generate two or more emphasis codes to be used for one emphasis driving. Two or more generated emphasis codes may have different shifted values using the same frequency information.

The data output circuit 281 may output data stored in the memory cell array 210 to the outside of the semiconductor memory device 200. The data output circuit 281 may be connected to the data output pad DQ. A transmission line may be connected to the data output pad DQ. The transmission line may be connected to the memory controller. The data output circuit 281 may output data to the memory controller through the data output pad DQ. In an example embodiment, the data output circuit 281 may perform the emphasis driving using the calibration data CAL_DATA. The data output circuit 281 may perform an emphasis driving using the emphasis data. The data output circuit 281 may perform the emphasis driving by further using a calibration code or an emphasis code.

Figure 3:
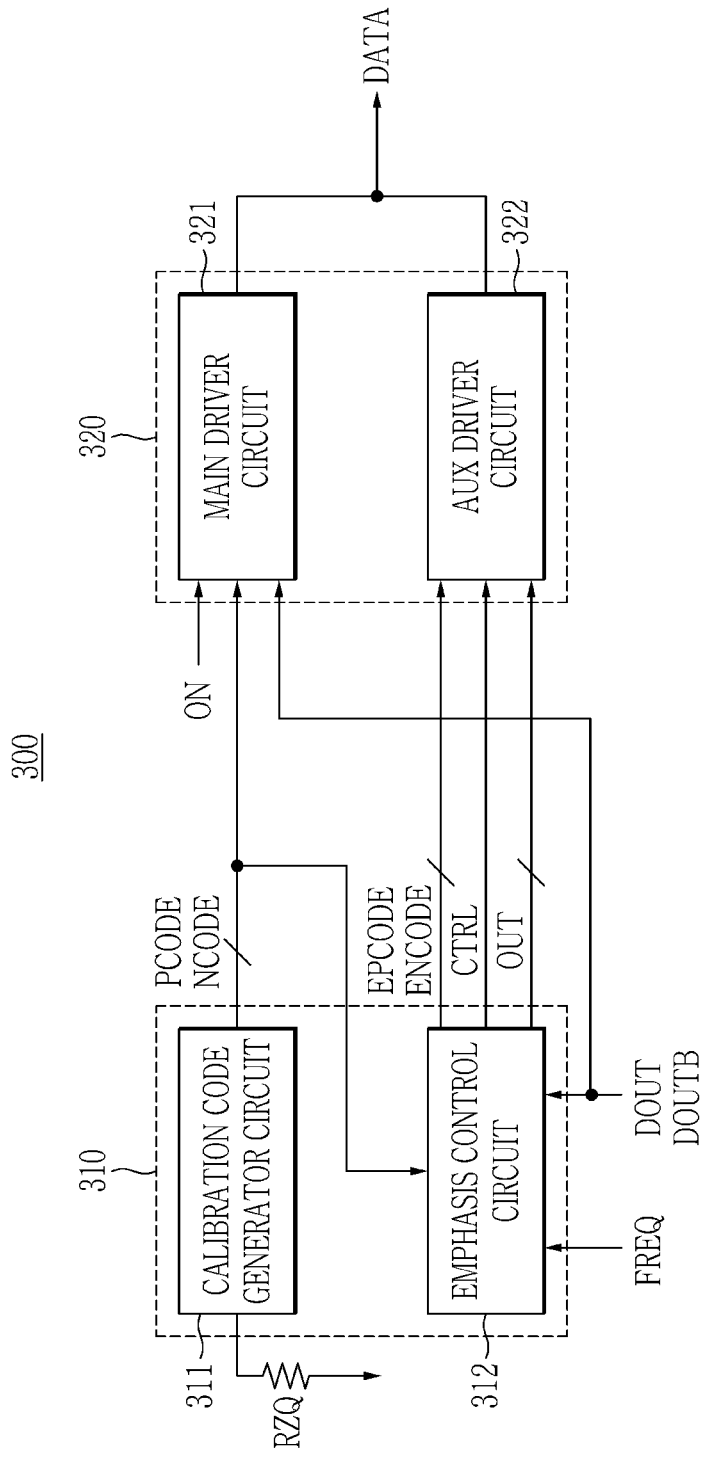
FIG. 3 is a block diagram illustrating a data output circuit and a calibration circuit of a semiconductor memory device according to an example embodiment.
Figure 4:
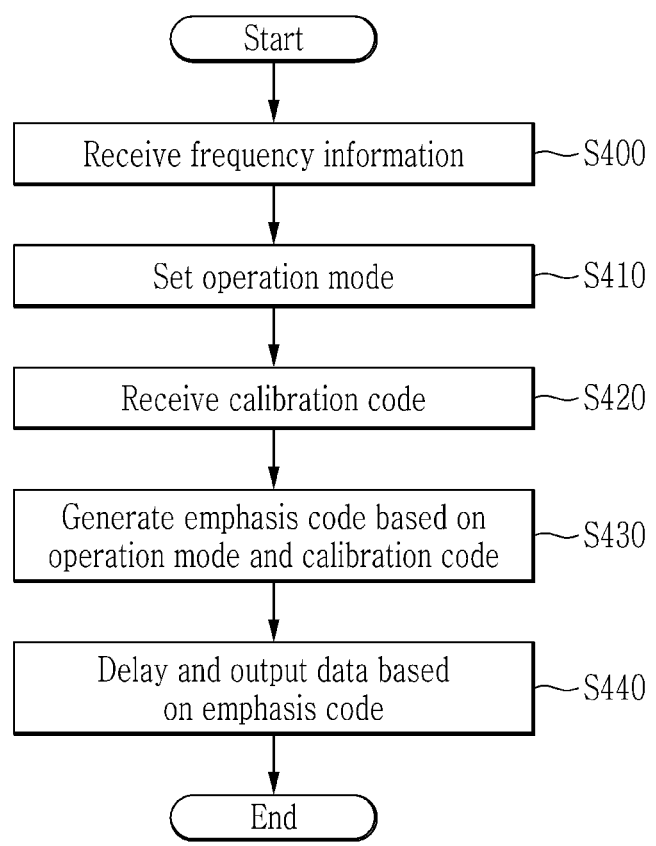
FIG. 4 is a diagram illustrating an example of an operation of the emphasis control circuit shown in FIG. 3.

FIG. 3 is a block diagram illustrating a data output circuit and a calibration circuit of a semiconductor memory device according to an example embodiment, and FIG. 4 is a diagram illustrating an example of an operation of the emphasis control circuit shown in FIG. 3.

Referring to FIG. 3, the data I/O circuit 300 may include a calibration circuit 310 and a data output circuit 320. The calibration circuit 310 may include a calibration code generator circuit 311 and an emphasis control circuit 312, and the data output circuit 320 may include a main driver circuit 321 and an auxiliary driver circuit 322.

The calibration code generator circuit 311 may generate calibration codes PCODE and NCODE using the ZQ resistor RZQ. According to some example embodiments, the calibration code generator circuit 311 performs ZQ calibration comparing the potential of the ZQ resistor RZQ with a reference potential, and generates a pull-up code PCODE and a pull-down code NCODE according to the ZQ calibration result. According to an example embodiment, the reference potential may be a predetermined reference potential.

Referring FIG. 3 and FIG. 4, in operation S400, the emphasis control circuit 312 receives frequency information FREQ. Then, in operation S410, the emphasis control circuit 312 sets an operation mode according to the frequency information FREQ.

According to some example embodiments, when the frequency indicated by the frequency information FREQ is high, the emphasis control circuit 312 may set an operation mode to perform the emphasis driving with a high driving strength. When the frequency indicated by the frequency information FREQ is low, the emphasis control circuit 312 may set an operation mode to perform the emphasis driving with a low driving strength.

According to some example embodiments, when the frequency indicated by the frequency information FREQ is high, the emphasis control circuit 312 may set an operation mode to perform the emphasis driving with a long delay period. When the frequency indicated by the frequency information FREQ is low, the emphasis control circuit 312 may set an operation mode for performing the emphasis driving with a short delay period.

According to some example embodiments, the emphasis control circuit 312 may determine a frequency level based on one or more frequency values, where the one or more frequency values may be set differently for each memory device according to characteristics of the memory device.

In operation S420, the emphasis control circuit 312 receives the calibration codes PCODE and NCODE S420. In operation S430, the emphasis control circuit 312 generates emphasis codes EPCODE and ENCODE using the operation mode and the calibration codes PCODE and NCODE.

According to some example embodiments, the emphasis control circuit 312 may generate the emphasis codes EPCODE and ENCODE by level-shifting the calibration codes PCODE and NCODE according to the operation mode. For example, when the operation mode corresponds to the high frequency, the emphasis control circuit 312 generates emphasis codes EPCODE and ENCODE by 1-bit level shifting of the calibration codes PCODE and NCODE, and when the operation mode corresponds to the low frequency, The emphasis control circuit 312 may generate emphasis codes EPCODE and ENCODE by 2-bit level shifting of the calibration codes PCODE and NCODE. The number of bits level-shifted in the operation mode corresponding to the high frequency may be less than or equal to the number of bits level-shifted in the operation mode corresponding to the low frequency. The number of bits level-shifted according to an operation mode may be different according to embodiments. According to some example embodiments, when the operation mode corresponds to the high frequency, the emphasis control logic circuit 312 generates emphasis codes EPCODE and ENCODE by 2-bit level shifting of the calibration codes PCODE and NCODE, and when the operation mode corresponds to the low frequency, the emphasis control logic circuit 312 may generate emphasis codes EPCODE and ENCODE by 3-bit level shifting of the calibration codes PCODE and NCODE.

In operation S440, the emphasis control circuit 312 may delay the data DOUT and DOUTB based on the emphasis codes EPCODE and ENCODE and output the data DOUT and DOUTB as the emphasis data OUT. According to an example embodiment, the emphasis control circuit 312 may receive the data DOUT and DOUTB provided from the I/O gating circuit 270 in FIG. 2, and output the data DOUT and DOUTB as the emphasis data OUT by adjusting the delay period by the emphasis codes EPCODE and ENCODE.

According to some example embodiments, the calibration code generator circuit 311 may generate the emphasis codes EPCODE and ENCODE by further using the frequency information FREQ. In this case, the emphasis codes EPCODE and ENCODE generation by the emphasis control circuit 312 may not be performed. Specifically, the calibration code generator circuit 311 may receive the frequency information FREQ and set an operation mode according to the frequency information FREQ. The calibration code generator circuit 311 may directly generate the emphasis codes EPCODE and ENCODE according to the operation mode. For example, the calibration code generator circuit 311 may compare the reference potential with the potential of the ZQ resistor (RZQ) distributed by the pull-up unit connected in series with the ZQ resistor (RZQ), and generate calibration codes PCODE, NCODE by increasing/decreasing a bit for adjusting the pull-up resistance of the pull-up unit according to the comparison result. The calibration code generator circuit 311 may generate the emphasis codes EPCODE and ENCODE by increasing the reference potential according to the operation mode. The calibration code generator circuit 311 may generate the emphasis codes EPCODE and ENCODE by raising the reference potential higher when the operation mode is an operation mode corresponding to a low frequency than when the operation mode is an operation mode corresponding to a high frequency. In addition, the calibration code generator circuit 311 may generate emphasis codes EPCODE, ENCODE corresponding to various operation modes even under the same PVT condition. At this time, the calibration code generator circuit 311 generates the emphasis codes EPCODE and ENCODE so that the generated emphasis code has a smaller value in the operation mode corresponding to the low frequency than in the operation mode corresponding to the high frequency.

The main driver circuit 321 may output data DATA having a predetermined level using the data DOUT and DOUTB, the control signal ON, and the calibration codes PCODE, NCODE provided from the I/O gating circuit (270 in FIG. 2). When enabled by the control signal ON, the main driver circuit 321 may output data DATA with an impedance value adjusted according to the calibration codes PCODE and NCODE. In this regard, an illustration of a structure and operations of the main driver circuit 321 will be described together with reference to FIG. 5.

Figure 5:
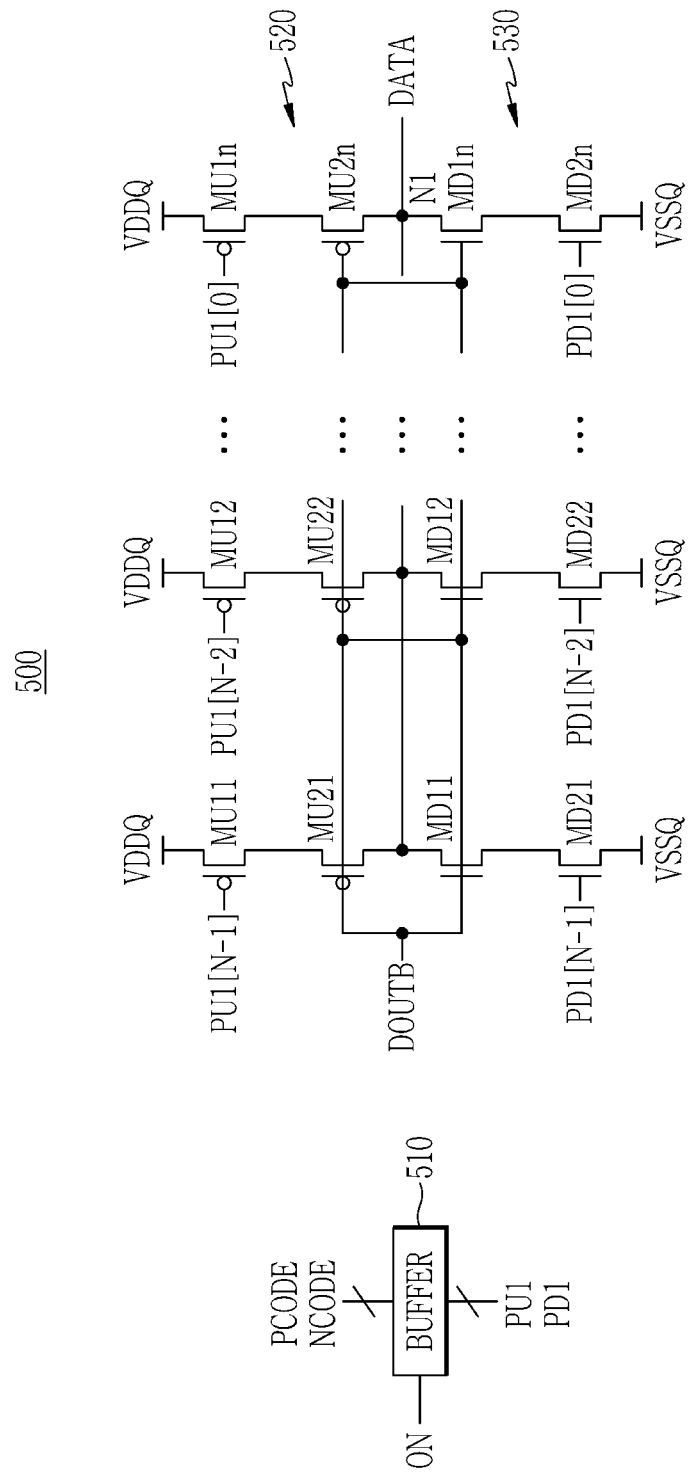
FIG. 5 is a circuit diagram schematically illustrating a main driver circuit according to an example embodiment.

FIG. 5 is a circuit diagram schematically illustrating a main driver circuit according to an example embodiment.

Referring to FIG. 5, the main driver circuit 500 may include a buffer 510, a main pull-up driver circuit 520, and a main pull-down driver circuit 530. In FIG. 5, an example embodiment in which the main pull-up driver circuit 520 includes a P-type transistor and the main pull-down driver circuit 530 includes an N-type transistor will be described.

The buffer 510 may output the calibration codes PCODE and NCODE as the main pull-up code PU1 and the main pull-down code PD1 according to the control signal ON. According to some example embodiments, the buffer 510 outputs the main pull-up code PU1 and the main pull-down code PD1 when the control signal is at the enable level (ON), or may not output the main pull-up code PU1 and the main pull-down code PD1 when the control signal is at the disable level (OFF).

According to some example embodiments, the buffer 510 may output the main pull-up code PU1 and the main pull-down code PD1 when the control signal is the enable level (ON) or may not output the main pull-up code PU1 and the main pull-down code PD1 when the control signal is at the disable level (OFF).

When the data signal DOUTB of the enable level and the main pull-up code PU1[N−1:0] are applied, the main pull-up driver circuit 520 may output data DATA of a 'high' level through the first node N1.

According to some example embodiments, in the main pull-up driver circuit 520, a plurality of transistor pairs MU11 and MU21, MU12 and MU22, . . . , MU1$n$ and MU2$n$ connected in series between the first power supply voltage VDDQ and the first node N1 may be connected in parallel. A voltage of a level corresponding to a corresponding bit value of the main pull-up code PU1 [N−1:0] may be applied to the gates of each of the plurality of transistors MU11, MU12, . . . , MU1$n$. The data signal DOUTB may be applied to the gates of the plurality of transistors MU21, MU22, . . . , MU2$n$.

The size (channel width W/channel length L) of the transistor (e.g. MU11) to which the voltage corresponding to the upper bit of the main pull-up code is applied is larger than the size (channel width W/channel length L) of the transistor (e.g. MU1$n$) to which the voltage corresponding to the lower bit of the main pull-up code is applied.

When the data signal DOUTB of the disable level and the main pull-down code PD1[N−1:0] are applied, the main pull-down driver circuit 530 may output data DATA of a 'low' level through the first node N1. According to some example embodiments, in the main pull-down driver circuit 530, a plurality of transistor pairs MD11 and MD21, MD12 and MD22, . . . , MD1$n$ and MD2$n$ connected in series between the second power supply voltage VSSQ and the first node N1 may be connected in parallel. A voltage of a level corresponding to a corresponding bit value of the main pull-down codes PD1[N−1:0] may be applied to the gates of each of the plurality of transistors MD11, MD12, . . . , MD1$n$. A data signal DOUTB may be applied to the gates of the plurality of transistors MD21, MD22, . . . , MD2$n$. The size (channel width W/channel length L) of the transistor (e.g. MD11) to which the voltage corresponding to the upper bit of the main pull-down code is applied is larger than the size (channel width W/channel length L) of the transistor (e.g. MD1$n$) to which the voltage corresponding to the lower bit of the main pull-down code is applied. Referring back to FIG. 3, the auxiliary driver circuit 322 performs an emphasis driving operation using the emphasis data OUT, the emphasis codes EPCODE and ENCODE, the control signal CTRL, and the calibration codes PCODE and NCODE.

When the emphasis driving is enabled by the control signal CTRL, the auxiliary driver circuit 322 may output the emphasis data OUT with an impedance value adjusted according to the emphasis codes EPCODE and ENCODE.

Hereinafter, the emphasis control circuit 312 for outputting the control signal CTRL, the emphasis data OUT, and the emphasis codes EPCODE and ENCODE according to an example embodiment will be described.

Figure 6:
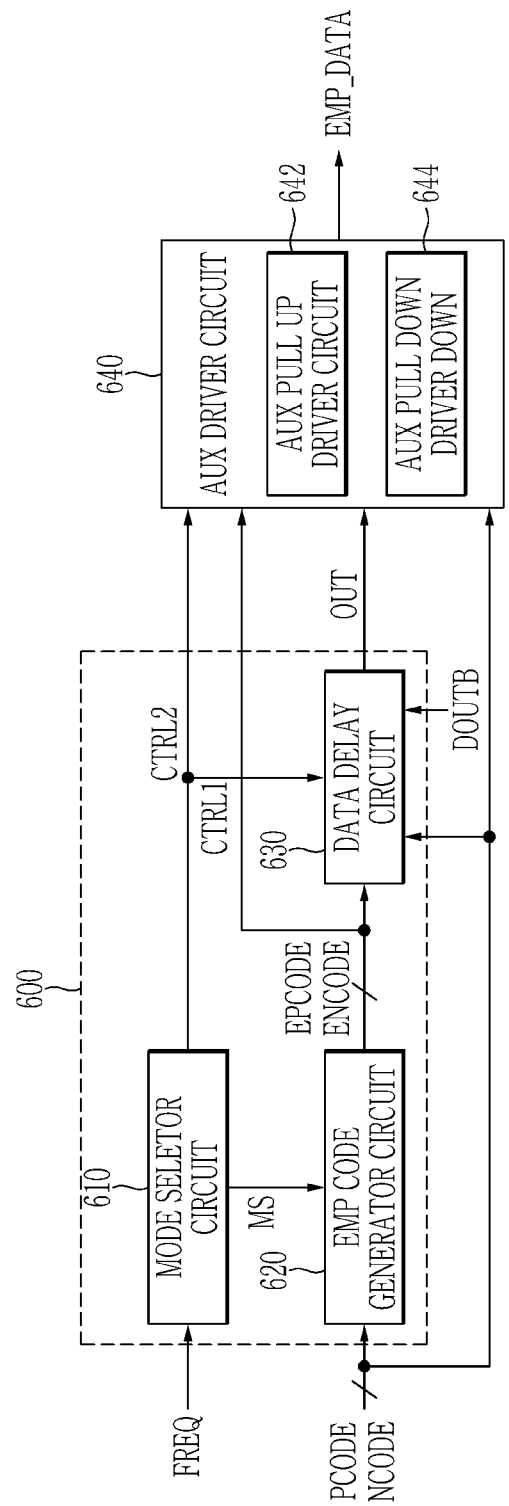
FIG. 6 is a block diagram illustrating an emphasis control circuit and an auxiliary driver circuit according to an example embodiment.

FIG. 6 is a block diagram illustrating an emphasis control circuit and an auxiliary driver circuit according to an example embodiment.

Referring to FIG. 6, the emphasis control circuit 600 may include a mode selector circuit 610, an emphasis code generator circuit 620, and a data delay circuit data delay circuit 630.

The mode selector circuit 610 may set an operation mode based on the frequency information FREQ. The mode selector circuit 610 outputs a mode signal MS indicating a set operation mode. According to some example embodiments, the mode selector circuit 610 may output a 2-bit mode signal MS. For example, when the operating frequency according to the frequency information FREQ is higher than the first reference frequency, the mode selector circuit 610 may set the operating mode to "MODE1" and output "00" as the mode signal MS. When the operating frequency according to the frequency information FREQ is less than or equal to the first reference frequency and exceeds the second reference frequency (where the first reference frequency is greater than the second reference frequency), the mode selector circuit 610 may set the operation mode to "MODE2" and output "01" as the mode signal MS. When the operating frequency according to the frequency information FREQ is equal to or less than the second reference frequency, the mode selector circuit 610 may set the operating mode to "MODE3" and output "11" as the mode signal MS. In addition, the mode selector circuit 610 may variously output the mode signal MS according to the operating frequency.

For example, the mode selector circuit 610 may generate and output a 1-bit mode signal MS when the reference frequency is one, and may generate and output a 3-bit mode signal MS when 4 to 7 reference frequencies are used.

The mode selector circuit 610 may generate the emphasis control signals CTRL1 and CTRL2. The mode selector circuit 610 may generate a control signal CTRL1 for controlling the operation of the data delay circuit 630 and a control signal CTRL2 for controlling the auxiliary driver circuit 640. According to some example embodiments, the data delay circuit 630 may operate by selectively using the emphasis codes EPCODE, ENCODE or the calibration codes PCODE, NCODE by the control signal CTRL1. The auxiliary driver circuit 640 may operate by selectively using the emphasis codes EPCODE, ENCODE or the calibration codes PCODE, NCODE by the control signal CTRL2.

The emphasis code generator circuit 620 may level-shift the calibration codes PCODE and NCODE according to the mode signal MS to output the emphasis codes EPCODE and ENCODE. According to some example embodiments, when receiving the mode signal MS indicating the operating mode corresponding to the low operating frequency, the emphasis code generator circuit 620 may level-shift the calibration codes PCODE, NCODE with a large number of bits. For example, if the mode signal MS is "11", the emphasis code generator circuit 620 performs 3-bit level shifting of the calibration codes PCODE and NCODE, if the mode signal MS is "01", the emphasis code generator circuit 620 performs 2-bit level shifting of the calibration codes PCODE and NCODE, and if the mode signal (MS) is "00", the emphasis code generator circuit 620 performs 1-bit level shifting of the calibration codes PCODE and NCODE. Hereinafter, it is assumed that the mode signal MS is a 2-bit signal. Hereinafter, the emphasis code generator circuit 620 will be described with reference to FIGS. 7A and 7B.

Figures 7A, 7B:
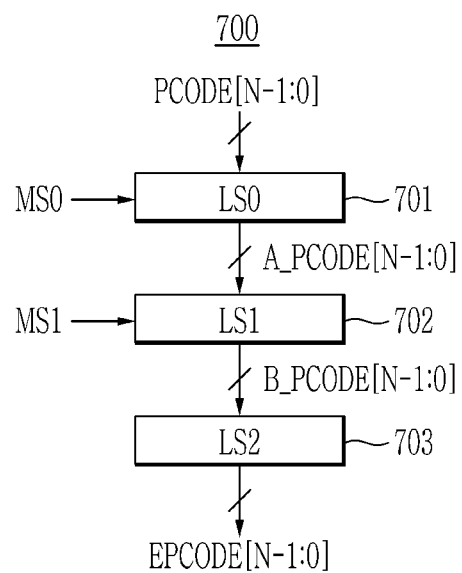
FIGS. 7A and 7B are diagrams illustrating an emphasis code generator circuit and an input/output data of the emphasis code generator circuit according to an example embodiment.

FIGS. 7A and 7B are diagrams illustrating an emphasis code generator circuit and an input/output data of the emphasis code generator circuit according to an example embodiment.

Referring to FIG. 7A, the emphasis code generator circuit 700 may include at least one level shifter 701, 702, and 703. According to some example embodiments, the level shifter 701 may level-shift the N-bit calibration code PCODE[N−1:0] by 1-bit according to the low-order bit value MS0 of the mode signal MS. The level shifter 702 may level-shift the N-bit shifted calibration code A_PCODE[N−1:0] output from the level shifter LS0 by one bit according to the upper bit value MS1 of the mode signal MS. The level shifter 703 may level-shift the N-bit shifted calibration code B_PCODE[N−1:0] output from the level shifter 701 by one bit to generate the emphasis code EPCODE[N−1:0]. According to some example embodiments, the emphasis code EPCODE[N−1:0] may have a smaller value than the calibration code PCODE[N−1:0].

Referring to FIG. 7B, if the bit value (MS0, MS1) is 0, the level shifters LS0 and LS1 bypass the input code without performing level shifting, and if the bit value (MS0, MS1) is 1, the level shifters LS0 and LS1 may perform level shifting with 1 bit.

As described above, level shifting is also performed on the calibration code NCODE[N−1:0] to generate an emphasis code.

Referring back to FIG. 6, the data delay circuit 630 may output the emphasis data OUT in which the data DOUTB is delayed by using the emphasis codes EPCODE, ENCODE or the calibration codes PCODE and NCODE. The data delay circuit 630 will be described together with reference to FIGS. 8 and 9.

Figure 8:
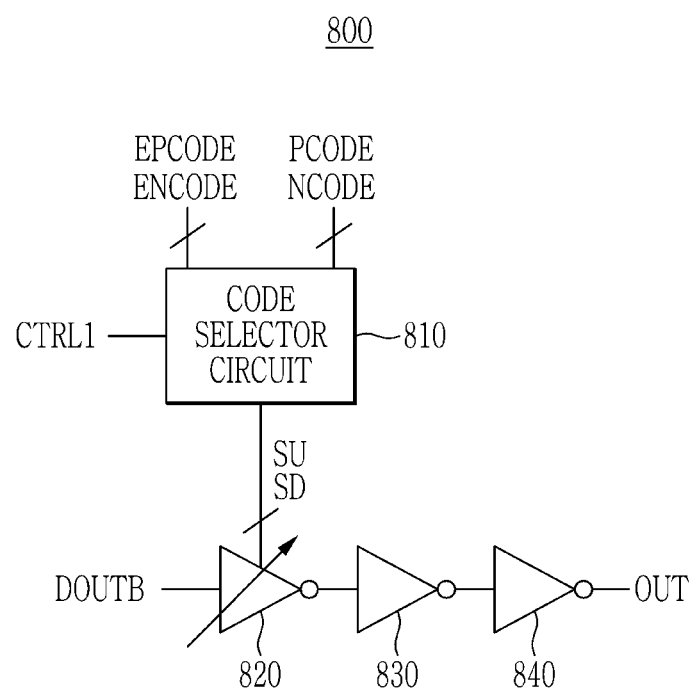
FIG. 8 is a diagram illustrating a data delay circuit according to an example embodiment.
Figure 9:
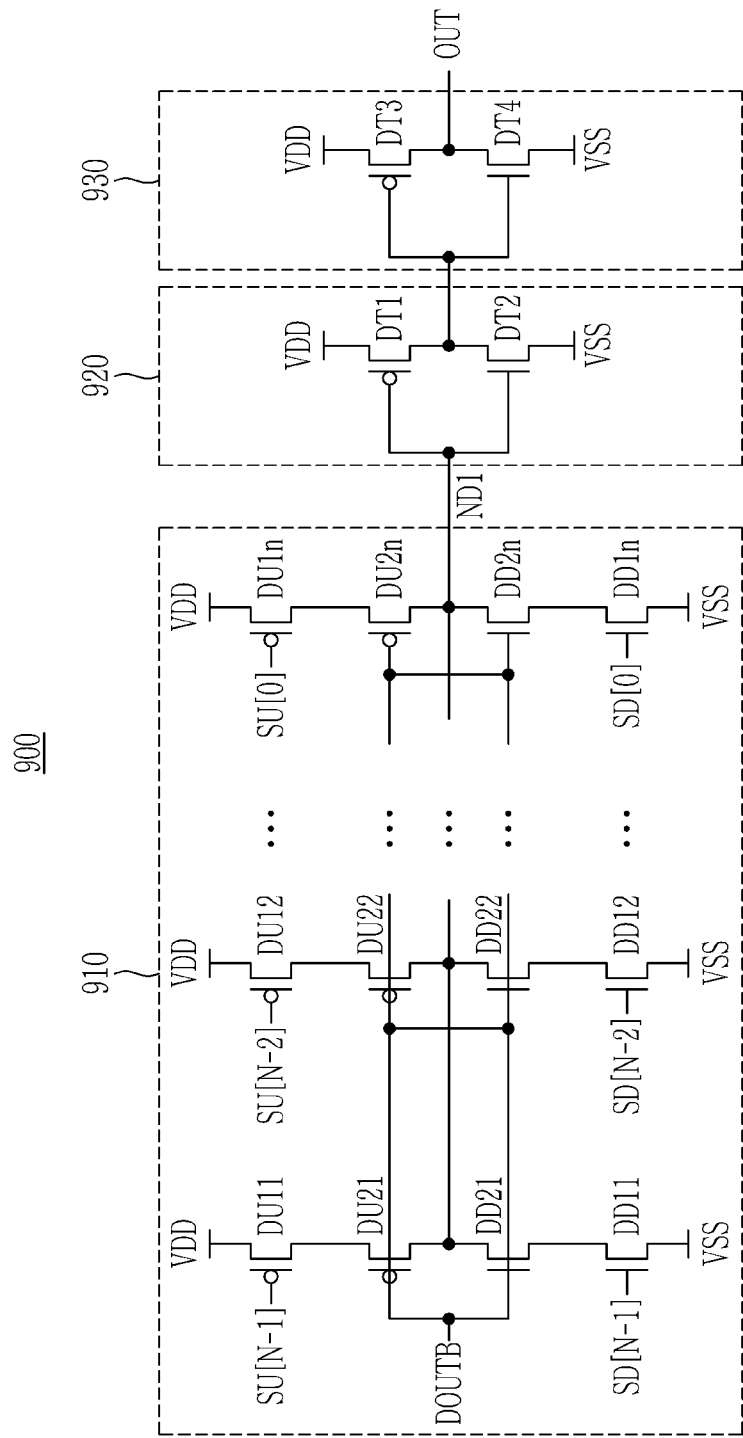
FIG. 9 is a circuit diagram schematically illustrating an example of the data delay circuit of FIG. 8.

FIG. 8 is a diagram illustrating a delay according to an example embodiment, and FIG. 9 is a circuit diagram schematically illustrating an example of the delay of FIG. 8.

Referring to FIG. 8, the data delay circuit 800 may include a code selector circuit 810 and a plurality of inverters 820, 830, and 840 connected in series. The code selector circuit 810 may output the calibration codes PCODE and NCODE or the emphasis codes EPCODE and ENCODE as the switching codes SU and SD according to the control signal CTRL1. The code selector circuit 810 may output the emphasis codes EPCODE and ENCODE as switching codes SU and SD so that the delay period is changed in response to a change in the operation mode according to the PVT and frequency information, or output the calibration codes PCODE and NCODE as switching codes SU and SD so that the delay period changes in response to the PVT.

The data delay circuit 800 may invert and delay the input data DOUTB to output the data signal OUT. A delay period of at least one of the plurality of inverters 820, 830, and 840 may be adjusted. According to some example embodiments, the driving speed of the inverter 820 is changed according to the switching codes SU and SD applied to the inverter 820. The time taken from when the data DOUTB is input to the inverter 820 until the output of the inverter 830 is changed by the data DOUTB varies according to a change in the driving speed of the inverter 820.

Referring to FIG. 9, a plurality of inverters 910, 920, and 930 are connected in series.

Among the plurality of inverters 910, 920, and 930, the inverter 910 may operate as a delay circuit in which a delay period is adjusted. According to the N-bit switching code (SU[N−1:0], SD[N−1:0]), the first inverter 910 may delay the data signal DOUTB and transmit it to the input node ND1 of the second inverter 930. According to some example embodiments, in the first inverter 910, a plurality of transistor pairs DU11 and DU21, DU12 and DU22, . . . , DU1*n* and DU2*n* connected in series between the first voltage VDD and the first node N1 may be connected in parallel. A voltage of a level corresponding to a corresponding bit value of the switching codes SU[N−1:0] may be applied to the gates of the transistors DU11, DU12, . . . , DU1*n*. The data signal DOUTB may be applied to the gates of the plurality of transistors DU21, DU22, . . . , DU2*n*. The driving speed at which the inverter 910 inverts and outputs the data signal DOUTB may vary according to the number of turned-on transistors among the plurality of transistors DU21, DU22, . . . , DU2*n*. For example, if the number of turned-on transistors DU21, DU22, . . . , DU2*n* is large, the driving speed is also high.

In the first inverter 910, a plurality of transistor pairs (DD11 and DD21, DD12 and DD22, . . . , DD1*n* and DD2*n*) connected in series between the second voltage VSS and the input node ND1 of the second inverter 930 may be connected in parallel. A voltage having a level corresponding to the corresponding bit value of the switching code SD[N−1:0] may be applied to the gates of the transistors DD11, DD12, . . . , DD1*n*. The data signal DOUTB may be applied to the gates of the transistors DD21, DD22, . . . , DD2*n*. Depending on the number of turned-on transistors among the plurality of transistors DD21, DD22, . . . , DD2*n*, a driving speed at which the inverter 910 inverts the data signal DOUTB to output a signal may be different. For example, if the number of the turned-on transistors DD21, DD22, . . . , DD2*n* is large, the driving speed is also high.

Referring back to FIG. 6, the auxiliary driver circuit 640 may include an auxiliary pull-up driver circuit 642 and an auxiliary pull-down driver circuit 644. The auxiliary driver circuit 640 may perform the emphasis driving by using the emphasis codes EPCODE, ENCODE or the calibration codes PCODE, NCODE on the data OUT which is inverted and delayed by the data delay circuit 630. The auxiliary driver circuit 640 may output the emphasis output data EMP_DATA. The auxiliary driver circuit 640 will be described with reference to FIG. 10.

Figure 10:
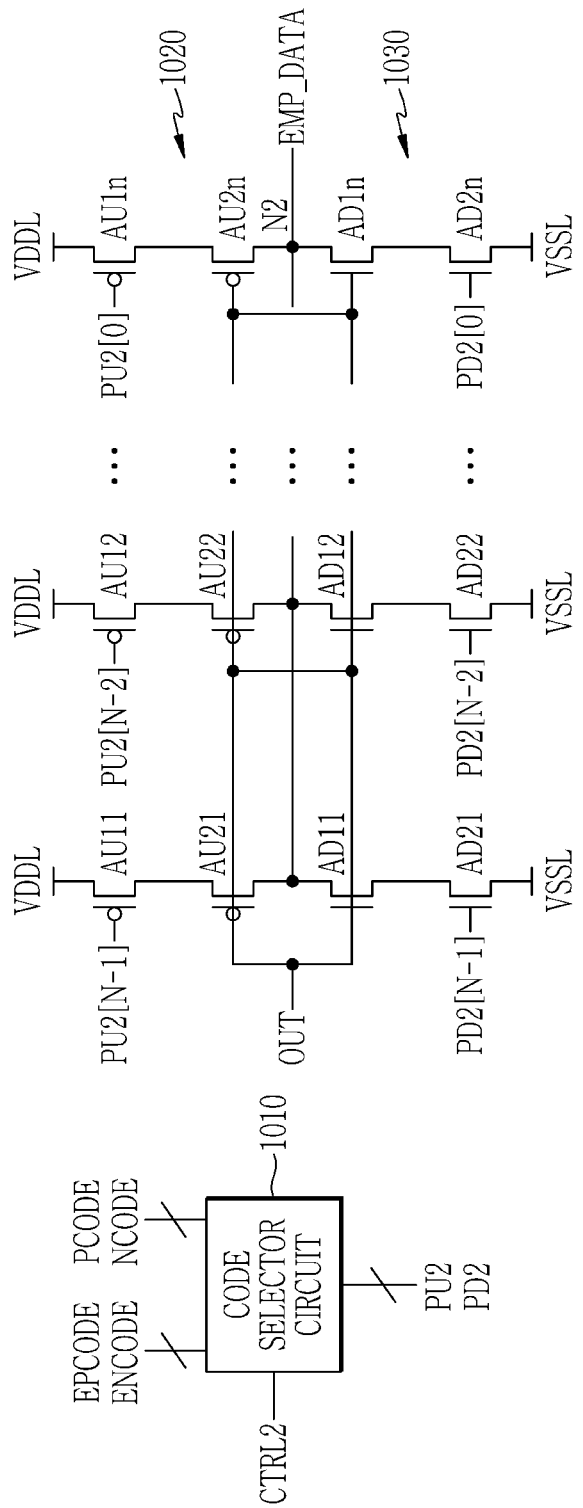
FIG. 10 is a circuit diagram schematically illustrating an auxiliary driver circuit according to an example embodiment.

FIG. 10 is a circuit diagram schematically illustrating an auxiliary driver circuit according to an example embodiment.

Referring to FIG. 10, the auxiliary driver circuit 1000 may include a code selector circuit 1010, an auxiliary pull-up driver circuit 1020, and an auxiliary pull-down driver circuit 1030. In FIG. 10, an example embodiment in which the auxiliary pull-up driver circuit 1020 includes a P-type transistor and the auxiliary pull-down driver circuit 1030 includes an N-type transistor will be described.

The code selector circuit 1010 may output the calibration codes PCODE and NCODE or the emphasis codes EPCODE and ENCODE as the auxiliary pull-up code PU2 and the auxiliary pull-down code PD2 according to the control signal CTRL2.

The code selector circuit 1010 outputs the emphasis codes EPCODE, ENCODE as the auxiliary pull-up code PU2 and the auxiliary pull-down code PD2 so that the delay period changes in response to the operation mode change according to the PVT and frequency information, or output the calibration codes PCODE and NCODE as the auxiliary pull-up code PU2 and the auxiliary pull-down code PD2 so that the delay period changes in response to the PVT.

When the data signal OUT of the enable level and the auxiliary pull-up code PU2[N−1:0] are applied, the auxiliary pull-up driver circuit 1020 may output the emphasis output data EMP_DATA of a 'high' level through the second node N2. Here, the second node N2 may be connected to the same pad as the first node N1 of FIG. 5. According to some example embodiments, in the auxiliary pull-up driver circuit 1020, a plurality of transistor pairs AU11 and AU21, AU12 and AU22, . . . , AU1n and AU2n connected in series between the third power supply voltage VDDL and the second node N2 may be connected in parallel. A voltage of a level corresponding to the corresponding bit value of the auxiliary pull-up code PU2[N−1:0] may be applied to the gates of the transistors AU11, AU12, . . . , AU1n. A data signal OUT is applied to the gates of the transistors AU21, AU22, . . . , AU2n. The size (channel width W/channel length L) of the transistor (e.g. AU11) to which the voltage corresponding to the upper bit of the auxiliary pull-up code PU2[N−1:0] is applied is larger than the size (channel width W/channel length L) of the transistor (e.g. AU1n) to which the voltage corresponding to the lower bit of the auxiliary pull-up code PU2[N−1:0] is applied.

When the data signal OUT of the disable level and the auxiliary pull-down code PD2[N−1:0] are applied, the auxiliary pull-down driver circuit 1030 may output the 'low' level emphasis output data EMP_DATA through the second node N2. According to some example embodiments, in the auxiliary pull-down driver circuit 1030, a plurality of transistor pairs AD11 and AD21, AD12 and AD22, . . . , AD1n and AD2n connected in series between the fourth power supply voltage VSSL and the second node N2 may be connected in parallel. A voltage of a level corresponding to the corresponding bit value of the auxiliary pull-down code PD2[N−1:0] may be applied to the gates of the transistors AD11, AD12, . . . , AD1n. The data signal OUT is applied to the gates of the transistors AD21, AD22, . . . , AD2n.

The size (channel width W/channel length L) of the transistor (e.g. AD11) to which the voltage corresponding to the upper bit of the auxiliary pull-up code PD2[N−1:0] is applied is larger than the size (channel width W/channel length L) of the transistor (e.g. AD1n) to which the voltage corresponding to the lower bit of the auxiliary pull-up code PD2[N−1:0] is applied.

Figure 11A:
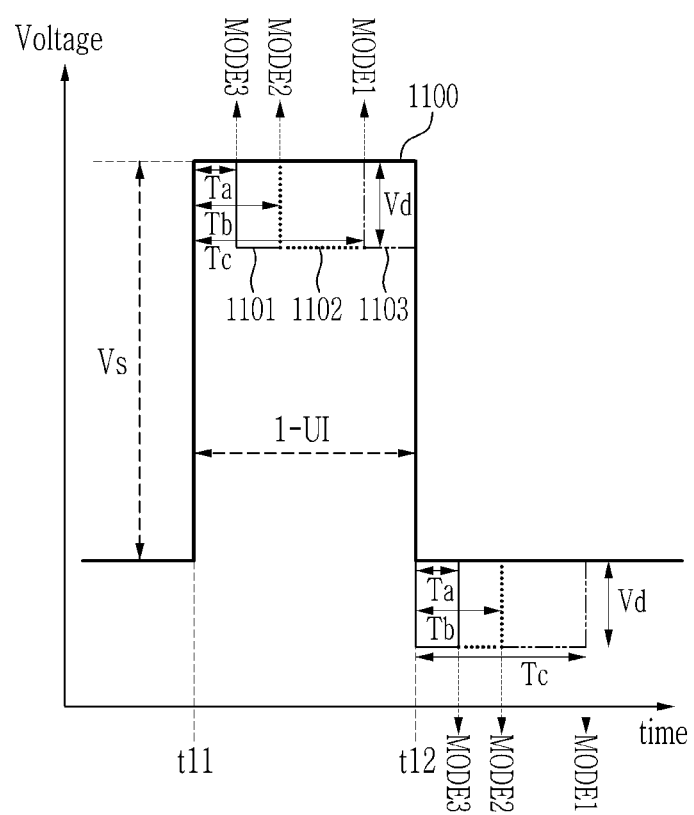
FIGS. 11A and 11B are graphs illustrating an output of a data output circuit according to an example embodiment.
Figure 11B:
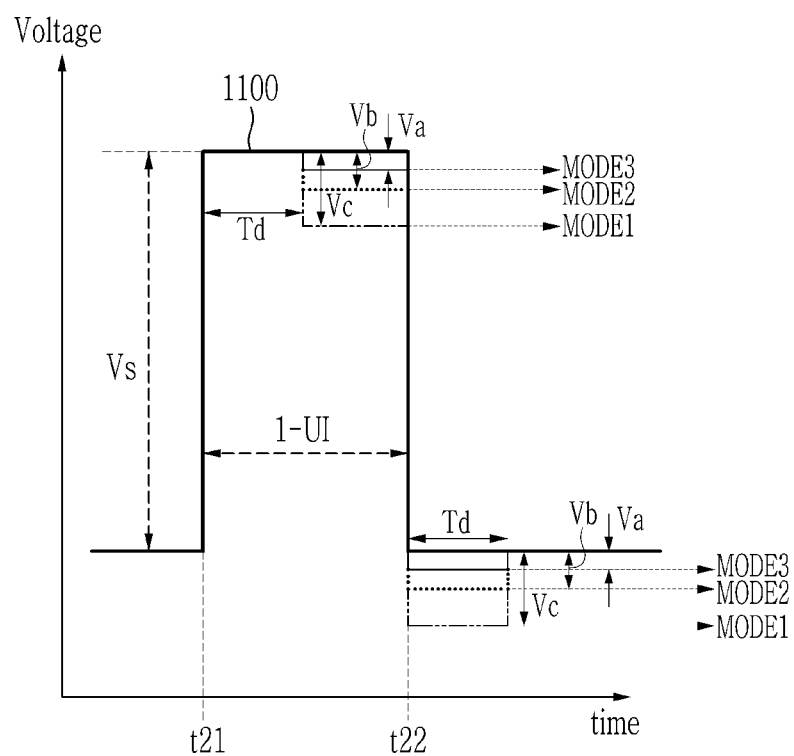

FIGS. 11A and 11B are graphs illustrating an output of a data output circuit according to an example embodiment.

Referring to FIG. 11A, a data signal for one unit interval (UI) is shown. The data signal may be a signal in which the output signal 1100 of the main driver circuit and the output signals 1101, 1102, and 1103 of the auxiliary driver circuit are combined. At time t11, the output signal of the main driver circuit may transition by the voltage Vs. At this time, the output signals 1101, 1102, and 1103 of the auxiliary driver circuit do not change. After the delay period Ta, Tb, and Tc determined by the operation mode according to the frequency information elapses from the time t11, the output signals 1101, 1102, and 1103 of the auxiliary driver circuit transition by the voltage Vd. That is, after the delay periods Ta, Tb, and Tc have elapsed from the time t11, the voltage of the data signal decreases by the voltage Vd. According to some example embodiments, the delay period Tc in the mode with high operating frequency MODE1 is the longest, and the delay period Ta in the mode with low operating frequency MODE3 is the shortest.

At time t12, the output signal 1100 of the main driver circuit may transition by the voltage Vs. At this time, the output signals 1101, 1102, and 1103 of the auxiliary driver circuit do not change. After the delay period Ta, Tb, and Tc determined by the operation mode according to the frequency information from the time t12 elapses, the output signal of the auxiliary driver circuit shifts by the voltage Vd. That is, after the delay periods Ta, Tb, and Tc have elapsed from the time t12, the voltage of the data signal increases by the voltage Vd.

According to the waveform of the output signal DATA, it is possible to overcome the problem due to the limitation of the channel bandwidth. The square wave itself will contain high frequencies in the spectrum. However, if the de-emphasis technique in which the level is decreased or increased in stages is applied to the square wave, high frequencies can be suppressed to a large extent. Accordingly, the limitation of the channel bandwidth may be overcome.

When the PVT is changed, as the delay period is changed by reflecting the calibration code corresponding to the PVT change, the output according to the emphasis driving may have a constant delay period even when the PVT is changed.

When the operating frequency is changed, by changing the calibration code according to the change of the operating frequency to adjust the delay period, the channel response characteristic according to the increase of the operating frequency can be improved.

Referring to FIG. 11B, the data signal may be a signal obtained by combining the output signal 1110 of the main driver circuit and the output signals 1111, 1112, and 1113 of the auxiliary driver circuit. At time t21, the output signal of the main driver circuit may transition by the voltage Vs. At this time, the output signals 1111, 1112, and 1113 of the auxiliary driver circuit do not change. After a predetermined delay period Td has elapsed from the time t21, the output signals 1111, 1112, and 1113 of the auxiliary driver circuit transition by the voltages Va, Vb, and Vc determined by the operation mode according to the frequency information.

That is, after the delay period Td elapses from the time t21, the voltage of the data signal decreases by the voltages Va, Vb, and Vc. According to some example embodiments, the changed voltage Vc in the mode MODE1 having the high operating frequency is the largest, and the changed voltage Va is the smallest in the mode MODE3 having the low operating frequency.

At time t22, the output signal 1110 of the main driver circuit may transition by the voltage Vs. At this time, the output signals 1111, 1112, and 1113 of the auxiliary driver circuit do not change. After the delay period Td has elapsed from the time T22, the output signals 1111, 1112, and 1113 of the auxiliary driver circuit transition by the voltages Va, Vb, and Vc determined by the operation mode according to the frequency information. That is, after the delay period Td elapses from the time t22, the voltage of the data signal increases by the voltages Va, Vb, and Vc.

When the PVT is changed, as the driving force of the emphasis driving is changed by reflecting the calibration code corresponding to the change in the PVT, the gain of the output according to the emphasis driving can be made constant even when the PVT is changed.

When the operating frequency is changed, by changing the calibration code according to the change of the operating frequency to adjust the driving force of the emphasis driving, the channel loss due to the increase of the operating frequency can be compensated.

In FIG. 11A and FIG. 11B, the waveform of the data signal according to the emphasis driving in which the delay period and the driving strength are changed has been described. According to an example embodiment, the delay period and the driving force may be changed together, and the waveform of the data signal at this time may have a form in which the waveform of the data signal of FIGS. 11A and 11B is combined.

Figure 12:
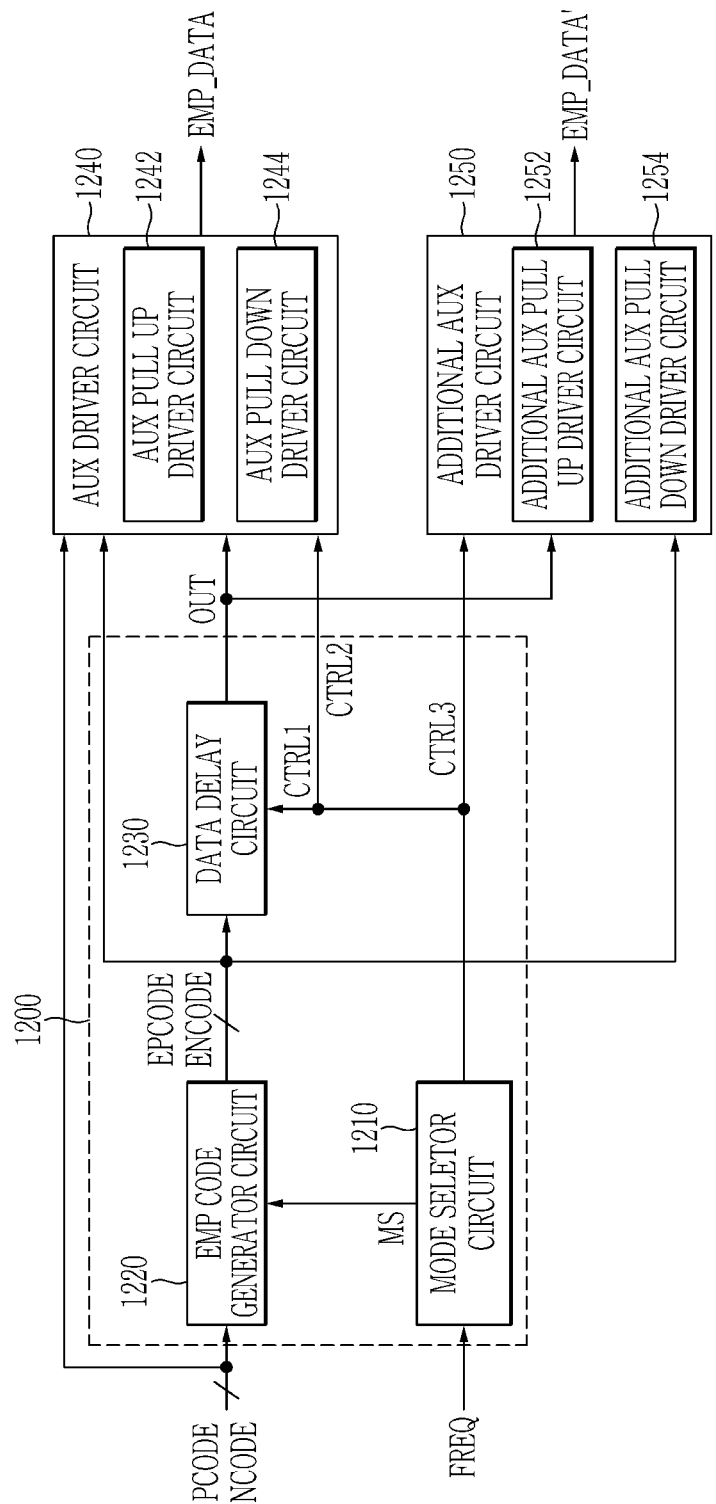
FIG. 12 is a block diagram illustrating an emphasis control circuit and an auxiliary driver circuit according to an example embodiment.

FIG. 12 is a block diagram illustrating an emphasis control circuit and an auxiliary driver circuit according to an example embodiment.

Referring to FIG. 12, the data output circuit further includes an additional auxiliary driver circuit 1250 in addition to the auxiliary driver circuit 1240. The emphasis control circuit 1200 may include a mode selector circuit 1210, an emphasis code generator circuit 1220, and a data delay circuit 1230. Descriptions of the same or similar components to the operations of the emphasis control circuit 600 and the auxiliary driver circuit 640 described in FIG. 6 will be omitted.

The mode selector circuit 1210 may further generate an emphasis control signal CTRL3 for controlling the additional auxiliary driver circuit 1250 in addition to the emphasis control signals CTRL1 and CTRL2. According to some example embodiments, the additional auxiliary driver circuit 1250 may operate or stop the operation using the emphasis codes EPCODE and ENCODE according to the control signal CTRL3.

The mode selector circuit 1210 may generate the emphasis control signal CTRL3 based on the frequency information FREQ. For example, when the operating frequency according to the frequency information FREQ is higher than the reference frequency, the mode selector circuit 1210 may generate the emphasis control signal CTRL3 so that the additional auxiliary driver circuit 1250 operates. When the operating frequency according to the frequency information FREQ is less than or equal to the reference frequency, the mode selector circuit 1210 may generate the emphasis control signal CTRL3 so that the additional auxiliary driver circuit 1250 does not operate.

The additional auxiliary driver circuit 1250 may include an additional auxiliary pull-up driver circuit 1252 and an additional auxiliary pull-down driver circuit 1254. The additional auxiliary driver circuit 1250 may perform the emphasis driving by using the emphasis codes EPCODE and ENCODE on the delayed data OUT inverted by the data delay circuit 1230. The additional auxiliary driver circuit 1250 may output the emphasis output data EMP_DATA'. An additional auxiliary driver circuit 640 will be described with reference to FIG. 13.

Figure 13:
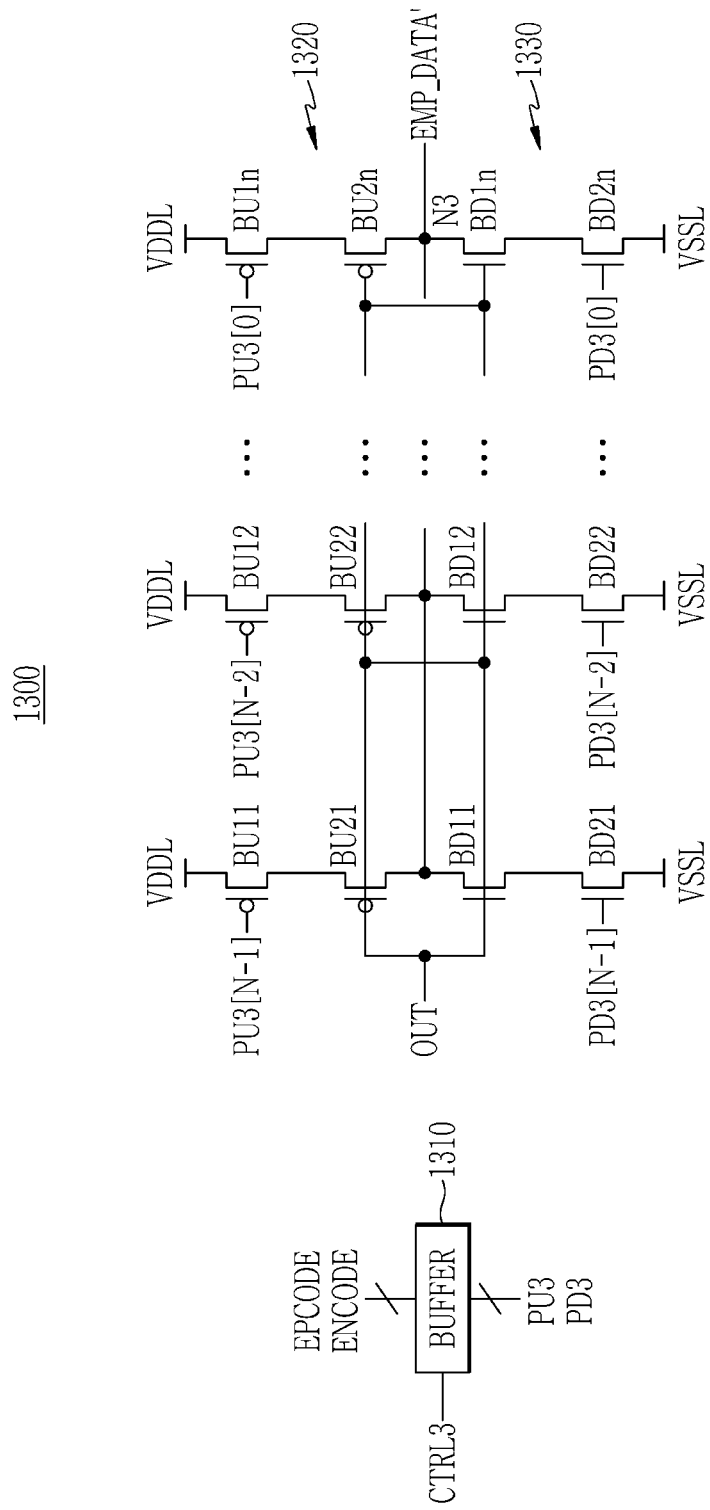
FIG. 13 is a circuit diagram schematically illustrating an additional auxiliary driver circuit according to an example embodiment.

FIG. 13 is a circuit diagram schematically illustrating an additional auxiliary driver circuit according to an example embodiment. Referring to FIG. 13, the additional auxiliary driver circuit 1300 may include a buffer 1310, an additional auxiliary pull-up driver circuit 1320, and an additional auxiliary pull-down driver circuit 1330. In FIG. 13, an example embodiment in which the additional auxiliary pull-up driver circuit 1320 includes a P-type transistor and the auxiliary pull-down driver circuit 1330 includes an N-type transistor will be described.

The buffer 1310 may output the emphasis codes EPCODE and ENCODE as the auxiliary pull-up code PU3 and the auxiliary pull-down code PD3 according to the control signal CTRL3. The buffer 1310 may output the emphasis codes EPCODE, ENCODE as the auxiliary pull-up code PU3 and the auxiliary pull-down code PD3 so that the delay period changes in response to the operation mode change according to the PVT and frequency information, or may not output the auxiliary pull-up code PU3 and the auxiliary pull-down code PD3.

When the enable level data signal OUT and the auxiliary pull-up code PU3[N−1:0] are applied, the additional auxiliary pull-up driver circuit 1320 may output the 'high' level emphasis output data EMP_DATA' through the third node N3. Here, the third node N3 may be connected to the same pad as the first node N1 of FIG. 5.

When the data signal OUT of the disable level and the auxiliary pull-down code PD3[N−1:0] are applied, the additional auxiliary pull-down driver circuit 1330 may output the 'low' level emphasis output data EMP_DATA' through the third node N3.

Since the additional auxiliary pull-up driver circuit 1320 and the additional auxiliary pull-down driver circuit 1330 are the same as or similar to the auxiliary pull-up driver circuit 1020 and the auxiliary pull-down driver circuit 1030 described in FIG. 10, a description thereof will be omitted.

Figure 14A:
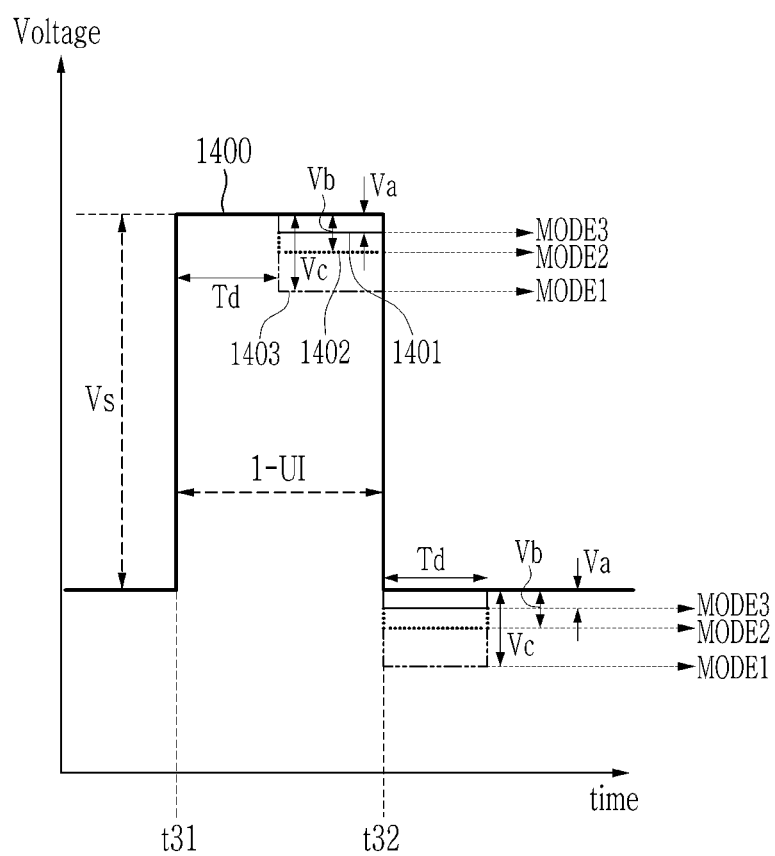
FIGS. 14A and 14B are graphs illustrating an output of a data output circuit according to an example embodiment.
Figure 14B:
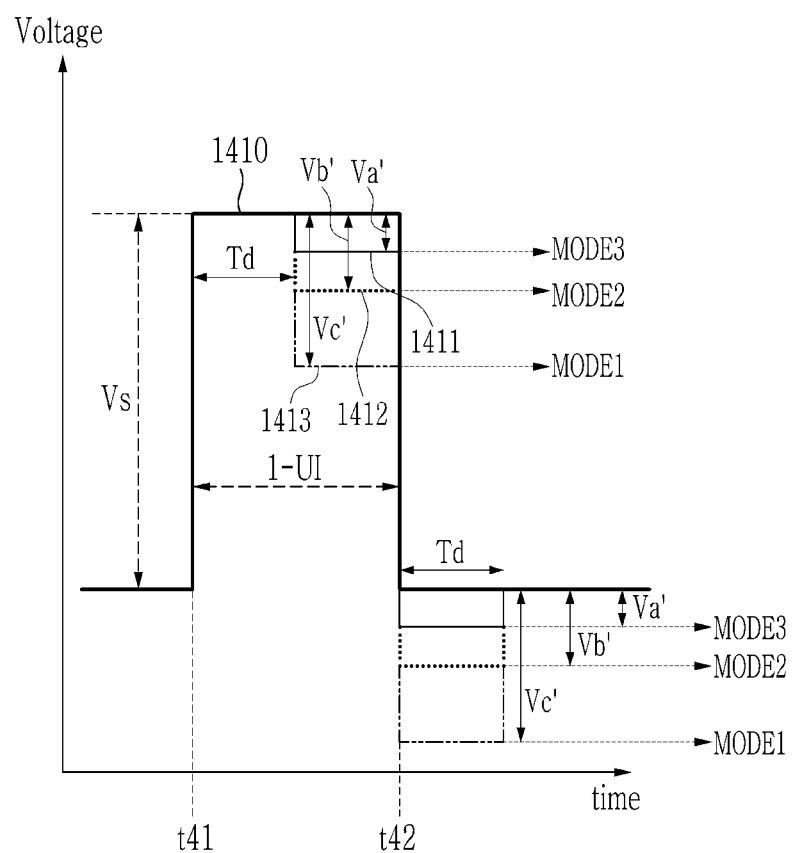

FIGS. 14A and 14B are graphs illustrating an output of a data output circuit according to an example embodiment.

FIG. 14A is a graph showing the waveform of the data signal when the additional auxiliary driver circuit does not operate, and FIG. 14B is a graph showing the waveform of the data signal when the additional auxiliary driver circuit operates.

Comparing the two graphs, after the same delay period Td elapses from the timings t31 and t41 at which the output signals 1400 and 1410 of the main driver circuit are transitioned, in each of the same operation modes (MODE1, MODE2, MODE3), the magnitudes Va', Vb', and Vc' of the output signals 1411, 1412, and 1413 when the additional auxiliary driver circuit is in operation are greater than the magnitudes Va, Vb, and Vc of the output signals 1401, 1402, and 1403 when the additional auxiliary driver circuit is not in operation. For example, when the operating frequency exceeds a predetermined reference frequency, an additional auxiliary driver circuit may be used to further increase the driving strength of the de-emphasis driving, thereby compensating for additional channel loss.

Figure 15:
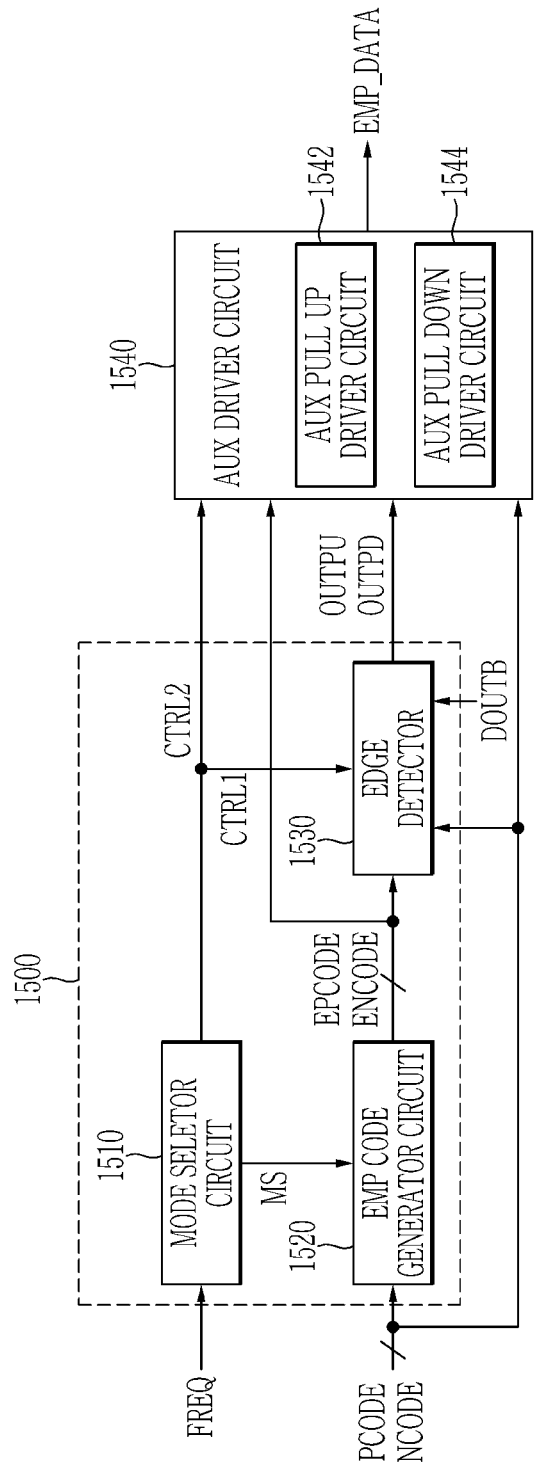
FIG. 15 is a block diagram illustrating an emphasis control circuit and an auxiliary driver circuit according to yet an example embodiment.

FIG. 15 is a block diagram illustrating an emphasis control circuit and an auxiliary driver circuit according to an example embodiment.

Referring to FIG. 15, the emphasis control circuit 1500 may include a mode selector circuit 1510, an emphasis code generator circuit 1520, and an edge detector circuit 1530. Here, descriptions of the mode selector circuit 1510 and the emphasis code generator circuit 1520 are omitted because they are the same as or similar to those of the mode selector circuit 610 and the emphasis code generator circuit 620 in FIG. 6.

The edge detector circuit 1530 may detect an edge of the data DOUTB. According to some example embodiments, the edge detector circuit 1530 may detect a rising edge of the data DOUTB and output the emphasis data OUTPU having an enable level to emphasize the data signal DATA for a period corresponding to the emphasis code EPCODE or the calibration code PCODE from the rising edge. The edge detector circuit 1530 may detect a falling edge of the data DOUTB and output the emphasis data OUTPD having an enable level to emphasize the data signal DATA by a period corresponding to the emphasis code ENCODE or the calibration code NCODE from the falling edge. The edge detector circuit 1530 will be described with reference to FIG. 16.

Figure 16:
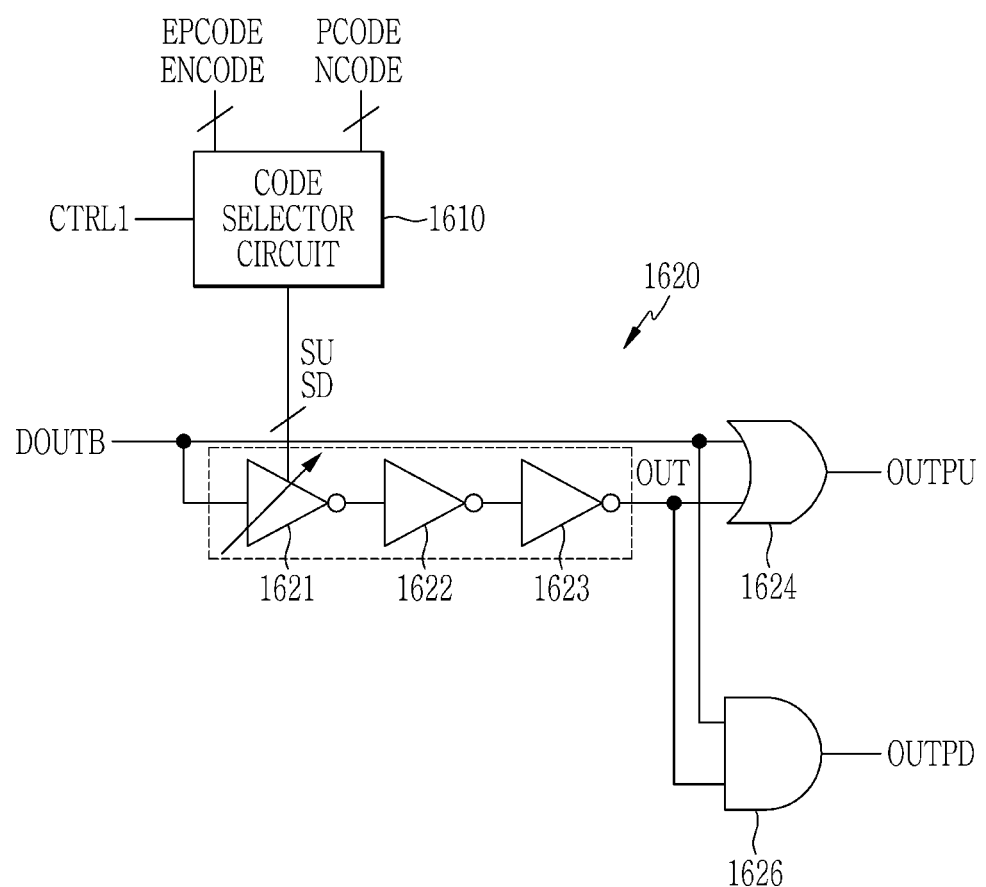
FIG. 16 is a diagram illustrating an edge detector circuit according to an example embodiment.

FIG. 16 is a diagram illustrating an edge detector circuit 1600 according to an example embodiment.

Referring to FIG. 16, the edge detector circuit 1600 may include a code selector circuit 1610 and an output signal generator circuit 1620. The code selector circuit 1610 may output the calibration codes PCODE and NCODE or the emphasis codes EPCODE and ENCODE as the switching codes SU and SD according to the control signal CTRL1. The code selector circuit 1610 may output the emphasis codes EPCODE, ENCODE as the switching codes SU, SD so that the delay period is changed in response to the operation mode change according to the PVT and frequency information, or output the calibration codes PCODE and NCODE as switching codes SU and SD so that the delay period is changed in response to the PVT.

The output signal generator circuit 1620 may perform an OR operation on the data signal DOUTB and the signal OUT in which the data signal DOUTB is delayed by the switching codes SU and SD and is inverted, to output the delayed data signal OUTPU. According to some example embodiments, the delayed data signal OUTPU has a "low" level when both the data signal DOUTB and the signal OUT are at a low level, and has a "high" level otherwise.

The output signal generator circuit 1620 may output the delayed data signal OUTPD by performing an AND operation on the data signal DOUTB and the data signal DOUTB delayed by the switching codes SU and SD and the inverted signal OUT. According to some example embodiments, the delayed data signal OUTPD has a "high" level when both the data signal DOUTB and the signal OUT are at a high level, and has a "low" level otherwise.

According to some example embodiments, the output signal generator circuit 1620 may include a plurality of inverters 1621, 1622, 1623 connected in series, an OR gate circuit 1624 and an AND gate circuit 1626. The data signal DOUTB may be input to one input terminal of the OR gate circuit 1624, and the signal OUT output from the inverter 1623 may be input to the other input terminal. The data signal DOUTB may be input to one input terminal of the AND gate circuit 1626, and the signal OUT output from the inverter 1623 may be input to the other input terminal.

Operations of the plurality of inverters 1621, 1622, and 1623 are the same as or similar to those of the inverters 910, 920, and 930 of FIG. 9, and thus a description thereof will be omitted.

Referring back to FIG. 15, the auxiliary driver circuit 1540 may include an auxiliary pull-up driver circuit 1542 and an auxiliary pull-down driver circuit 1544. The auxiliary driver circuit 1540 may perform the emphasis driving by using the emphasis codes EPCODE and ENCODE or the calibration code PCODE, NCODE for the data OUTPU, OUTPD inverted and delayed by the edge detector circuit 1530. The auxiliary driver circuit 1540 may output the emphasis output data EMP_DATA. The auxiliary driver circuit 1540 will be described with reference to FIG. 17.

Figure 17:
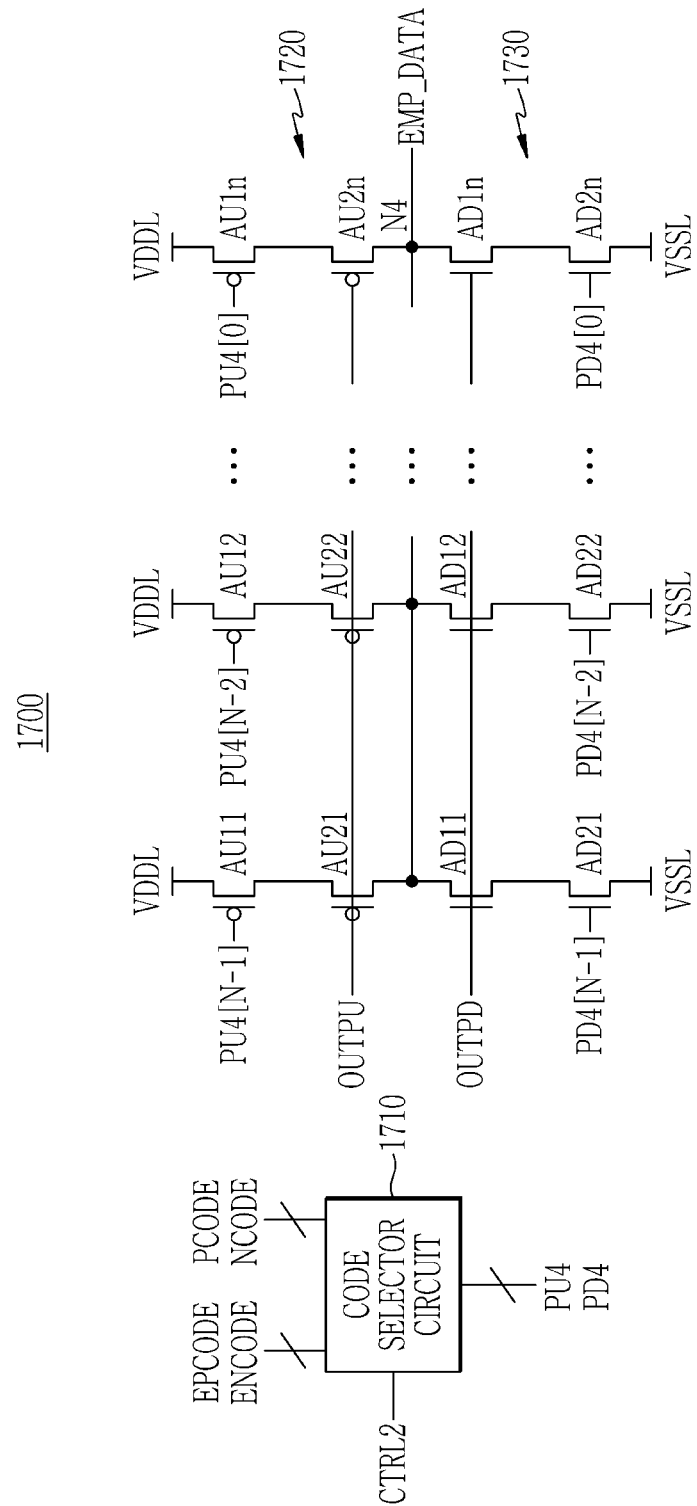
FIG. 17 is a circuit diagram schematically illustrating an auxiliary driver circuit according to an example embodiment.

FIG. 17 is a circuit diagram schematically illustrating an auxiliary driver circuit according to an example embodiment.

Referring to FIG. 17, the auxiliary driver circuit 1700 may include a code selector circuit 1710, an auxiliary pull-up driver circuit 1720, and an auxiliary pull-down driver circuit 1730. In FIG. 17, an example embodiment in which the auxiliary pull-up driver circuit 1720 includes a P-type transistor and the auxiliary pull-down driver circuit 1730 includes an N-type transistor will be described.

As the code selector circuit 1710 is the same as or similar to the code selector circuit 1010 described with reference to FIG. 10, a description thereof will be omitted.

With respect to the auxiliary pull-up driver circuit 1720 and the auxiliary pull-down driver circuit 1730, the same or similar parts to the description of the auxiliary pull-up driver circuit 1020 and the auxiliary pull-down driver circuit 1030 described with reference to FIG. 10 will be omitted.

When the enable level data signal OUTPU and the auxiliary pull-up code PU4[N−1:0] are applied, the auxiliary pull-up driver circuit 1720 may output the 'high' level emphasis output data EMP_DATA through the second node N2. Here, the fourth node N4 may be connected to the same pad as the first node N1 of FIG. 5.

According to some example embodiments, in the auxiliary pull-up driver circuit 1720, a plurality of transistor pairs AU11 and AU21, AU12 and AU22, . . . , AU1n and AU2n connected in series between the third power supply voltage VDDL and the fourth node N4 may be connected in parallel. A voltage of a level corresponding to the corresponding bit value of the auxiliary pull-up code PU4[N−1:0] may be applied to the gates of the transistors AU11, AU12, . . . , AU1n. The data signal OUTPU is applied to the gates of the transistors AU21, AU22, . . . , AU2n.

When the enable level data signal OUTPD and the auxiliary pull-down code PD4[N−1:0] are applied, the auxiliary pull-down driver circuit 1730 may output the 'low' level emphasis output data EMP_DATA through the fourth node N4. According to some example embodiments, in the auxiliary pull-down driver circuit 1730, a plurality of transistor pairs AD11 and AD21, AD12 and AD22, . . . , AD1n and AD2n connected in series between the fourth power supply voltage VSSL and the fourth node N4 may be connected in parallel. A voltage of a level corresponding to the corresponding bit value of the auxiliary pull-down code PD4[N−1:0] may be applied to the gates of the transistors AD11, AD12, . . . , AD1n. A data signal OUTPD is applied to the gates of the transistors AD21, AD22, . . . , AD2n.

Figure 18A:
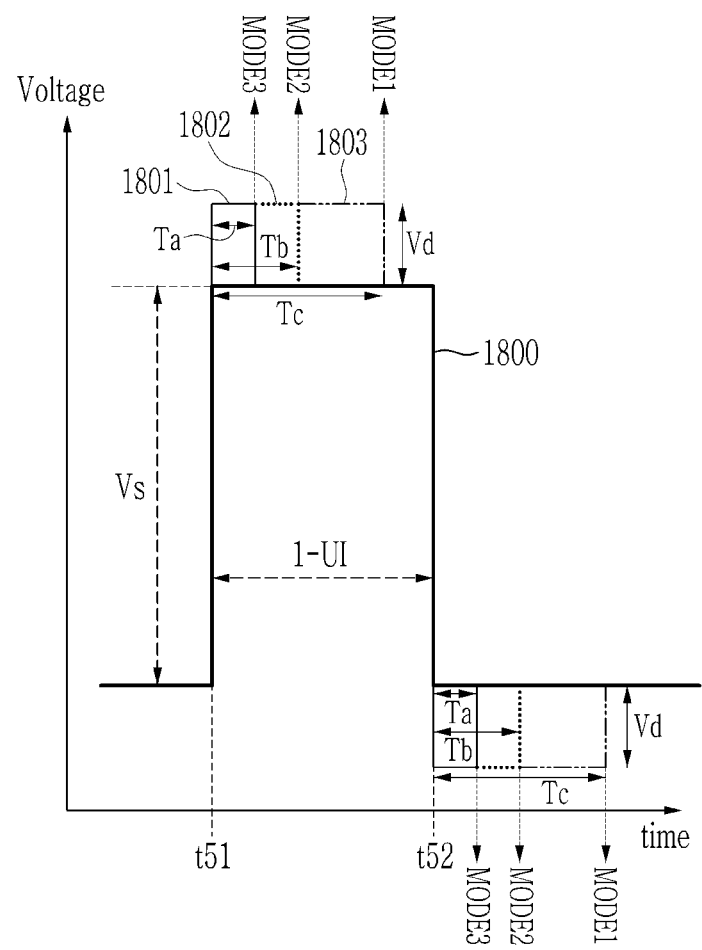
FIGS. 18A and 18B are graphs illustrating an output of a data output circuit according to an example embodiment.
Figure 18B:
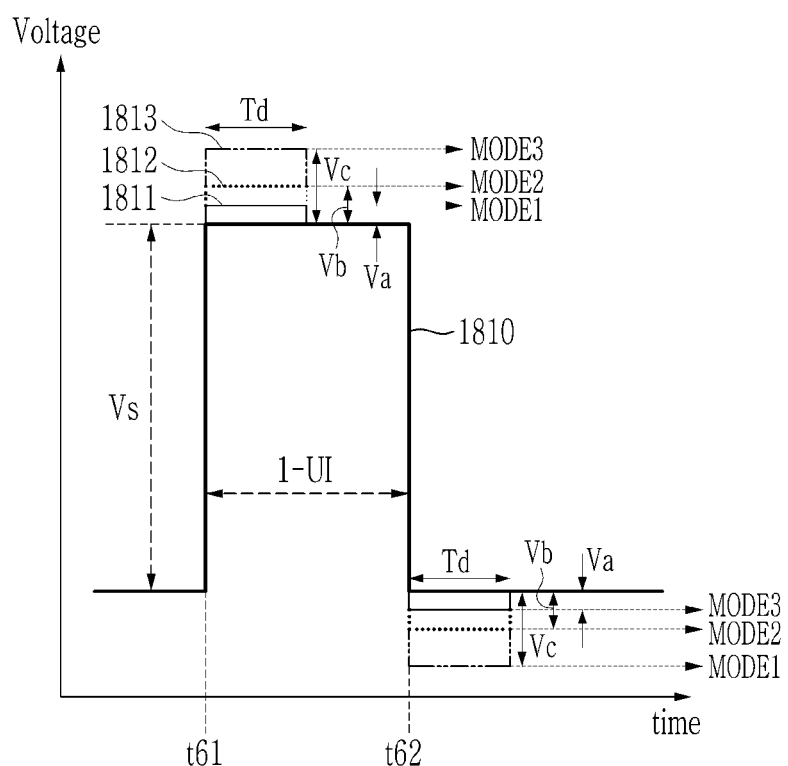

FIGS. 18A and 18B are graphs illustrating an output of a data output circuit according to an example embodiment.

Referring to FIG. 18A, the data signal may be a signal obtained by combining the output signal 1800 of the main driver circuit and the output signals 1801, 1802, and 1803 of the auxiliary driver circuit. At time t51, the output signal 1800 of the main driver circuit may transition by the voltage Vs. At this time, the output signals 1801, 1802, and 1803 of the auxiliary driver circuit also transition by a predetermined voltage Vd. That is, at time t51, the voltage of the data signal further increases by the voltage Vd by the pre-emphasis driving. After the delay period Ta, Tb, and Tc determined by the operation mode according to the frequency information from the time t51 elapses, the output signals 1801, 1802, and 1803 of the auxiliary driver circuit transition by the voltage Vd. That is, after the delay periods Ta, Tb, and Tc have elapsed from the time t51, the voltage of the data signal decreases by the voltage Vd. According to some example embodiments, the delay period Tc in the mode with high operating frequency MODE1 is the longest, and the delay period Ta in the mode with low operating frequency MODE3 is the shortest.

At time t52, the output signal 1800 of the main driver circuit may transition by the voltage Vs. At this time, the output signals 1801, 1802, and 1803 of the auxiliary driver circuit also transition by a predetermined voltage Vd. That is, at time t52, the voltage of the data signal is further reduced by the voltage Vd by the pre-emphasis driving. After the delay period Ta, Tb, and Tc determined by the operation mode according to the frequency information from the time t52 elapses, the output signals 1801, 1802, and 1803 of the auxiliary driver circuit transition by the voltage Vd. That is, after the delay periods Ta, Tb, and Tc have elapsed from the time t52, the voltage of the data signal increases by the voltage Vd.

That is, when the output signal 1800 of the main driver circuit transitions from the low level to the high level and when the high level transitions from the high level to the low level, it may be driven with a higher driving force during the delay periods Ta, Tb, and Tc determined by the operation mode according to the frequency information. Since the data signal can be strengthened according to the pre-emphasis operation, it is possible to prevent attenuation of the signal due to a reflection phenomenon and the occurrence of an error during data restoration.

When the PVT is changed, as the delay period is changed by reflecting the calibration code corresponding to the PVT change, the output according to the emphasis driving may have a constant delay period even when the PVT is changed.

When the operating frequency is changed, by changing the calibration code according to the change of the operating frequency to adjust the delay period, the channel response characteristic according to the increase of the operating frequency can be improved.

Referring to FIG. 18B, at time t61, the output signal 1810 of the main driver circuit may transition by the voltage Vs. At this time, the output signals 1811, 1812, and 1813 of the auxiliary driver circuit also transition by the voltages Va, Vb, and Vc determined by the operation mode according to the frequency information. That is, at time t61, the voltage of the data signal further increases by the voltages Va, Vb, and Vc according to the operation mode due to the pre-emphasis driving. After a predetermined delay period Td has elapsed from the time t61, the output signal of the auxiliary driver circuit transitions by the voltages Va, Vb, and Vc determined by the operation mode according to the frequency information. That is, after the delay period Td elapses from the time t61, the voltage of the data signal decreases by the voltages Va, Vb, and Vc. According to some example embodiments, the changed voltage Vc in the mode MODE1 having the high operating frequency is the largest, and the changed voltage Va is the smallest in the mode MODE3 having the low operating frequency.

At time t62, the output signal 1810 of the main driver circuit may transition by the voltage Vs. At this time, the output signals 1811, 1812, and 1813 of the auxiliary driver circuit also transition by the voltages Va, Vb, and Vc determined by the operation mode according to the frequency information. That is, at time t62, the voltage of the data signal is further reduced by the voltages Va, Vb, and Vc due to the pre-emphasis driving. After the delay period Td has elapsed from the time t62, the output signals 1811, 1812, and 1813 of the auxiliary driver circuit transition by the voltages Va, Vb, and Vc determined by the operation mode according to the frequency information. That is, after the delay period Td elapses from the time t62, the voltage of the data signal increases by the voltages Va, Vb, and Vc.

When the PVT is changed, since the driving strength of the emphasis driving is changed by reflecting the calibration code corresponding to the change in the PVT, the gain of the output according to the emphasis driving can be constant even when the PVT is changed.

When the operating frequency is changed, by changing the calibration code according to the change of the operating frequency to adjust the driving force of the emphasis driving, the channel loss due to the increase of the operating frequency can be compensated.

The waveforms of the data signals according to the emphasis driving in which the delay period and the driving strength are changed have been described in FIGS. 18A and 18B, respectively. According to an example embodiment, the delay period and the driving strength may be changed together, and the waveform of the data signal in this case may have a form in which the waveform of the data signals of FIG. 18A and FIG. 18B are combined.

Figure 19:
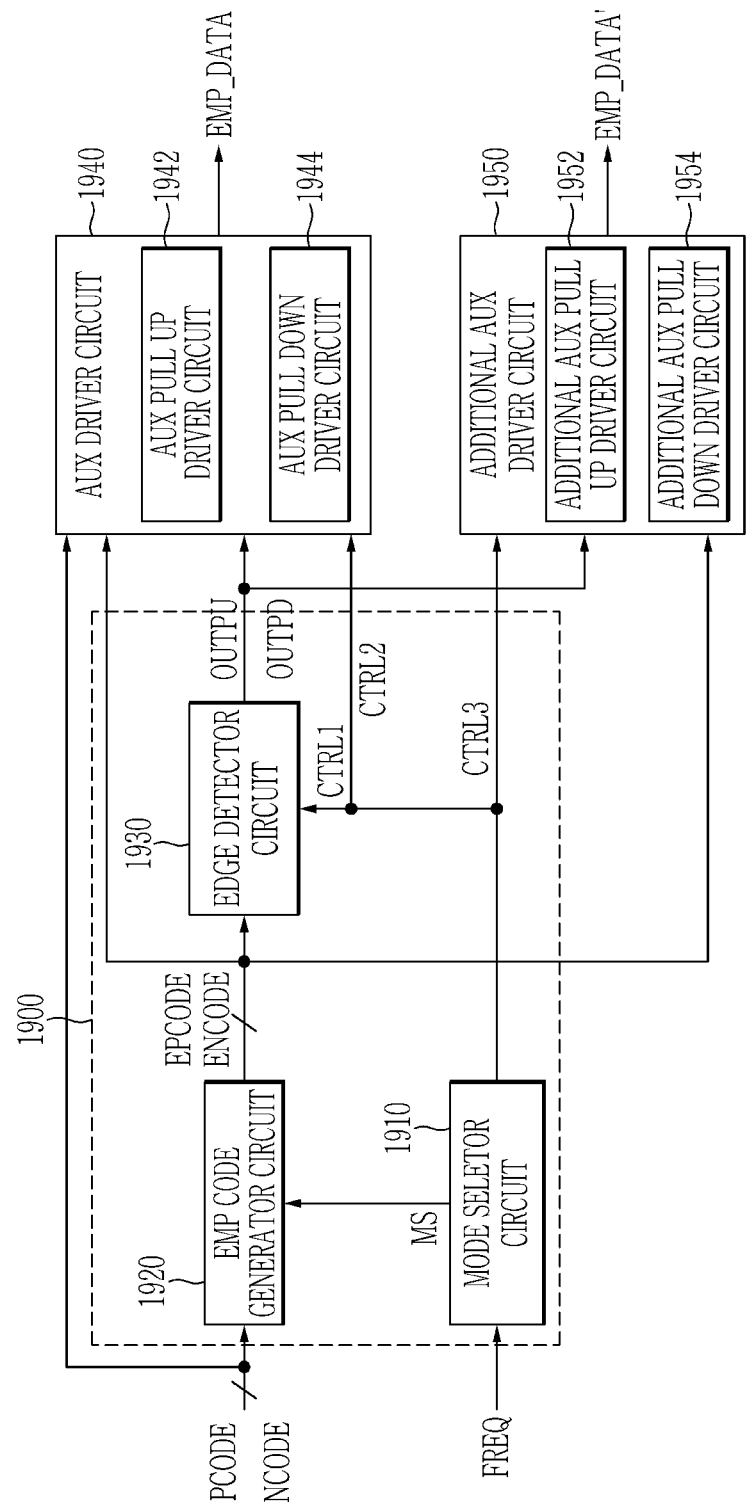
FIG. 19 is a block diagram illustrating an emphasis control circuit and an auxiliary driver circuit according to an example embodiment.

FIG. 19 is a block diagram illustrating an emphasis control circuit and an auxiliary driver circuit according to an example embodiment.

Referring to FIG. 19, the data output circuit further includes an additional auxiliary driver circuit 1950 in addition to the auxiliary driver circuit 1940. The emphasis control circuit 1900 may include a mode selector circuit 1910, an emphasis code generator circuit 1920, and an edge detector circuit 1930. Elements identical to or similar to those of the operation of the emphasis control circuit 1500 and the auxiliary driver circuit 1540 described in FIG. 15 will be omitted.

The mode selector circuit 1910 may further generate an emphasis control signal CTRL3 for controlling the additional auxiliary driver circuit 1950 in addition to the emphasis control signals CTRL1 and CTRL2. According to some example embodiments, the additional auxiliary driver circuit 1950 may operate using the emphasis codes EPCODE and ENCODE or stop the operation according to the control signal CTRL3.

The mode selector circuit 1910 may generate the emphasis control signal CTRL3 based on the frequency information FREQ. For example, if the operating frequency according to the frequency information FREQ is higher than the reference frequency, the mode selector circuit 1910 may generate the emphasis control signal CTRL3 to operate the additional auxiliary driver circuit 1950. If the operating frequency according to the frequency information (FREQ) is less than or equal to the reference frequency, the mode selector circuit 1910 may generate the emphasis control signal CTRL3 so that the additional auxiliary driver circuit 1950 does not operate.

The additional auxiliary driver circuit 1950 may include an additional auxiliary pull-up driver circuit 1952 and an additional auxiliary pull-down driver circuit 1954. The additional auxiliary driver circuit 1950 may perform emphasis driving by using the emphasis codes EPCODE and ENCODE on the data OUT inverted and delayed by the edge detector circuit 1930. The additional auxiliary driver circuit 1950 may output the emphasis output data EMP_DATA'. An additional auxiliary driver circuit 1950 will be described with reference to FIG. 20.

Figure 20:
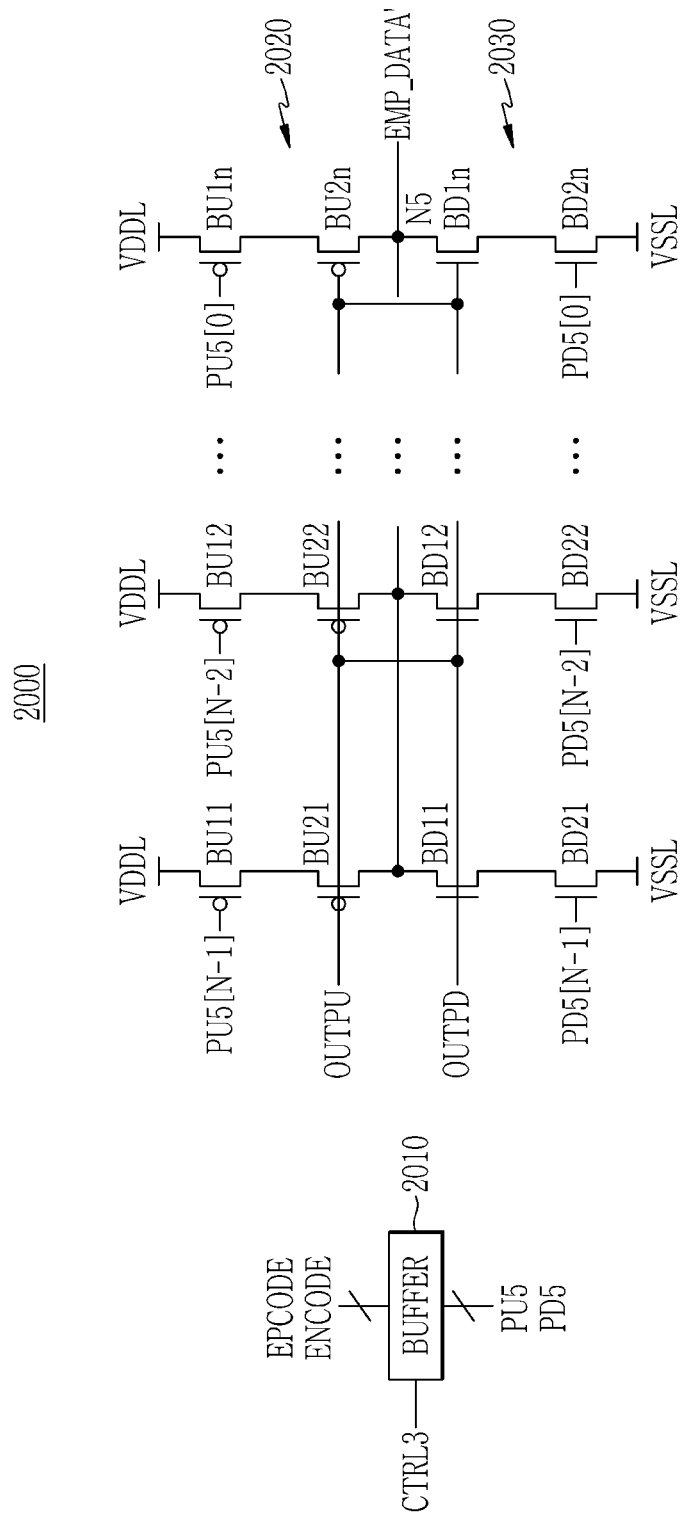
FIG. 20 is a circuit diagram schematically illustrating an additional auxiliary driver circuit according to an example embodiment.

FIG. 20 is a circuit diagram schematically illustrating an additional auxiliary driver circuit according to an example embodiment.

Referring to FIG. 20, the additional auxiliary driver circuit 2000 may include a buffer 2010, an additional auxiliary pull-up driver circuit 2020, and an additional auxiliary pull-down driver circuit 2030. In FIG. 20, an example embodiment in which the additional auxiliary pull-up driver circuit 2020 includes a P-type transistor and the auxiliary pull-down driver circuit 2030 includes an N-type transistor will be described.

The buffer 2010 may output the emphasis codes EPCODE and ENCODE as the auxiliary pull-up code PU3 and the auxiliary pull-down code PD5 according to the control signal CTRL3. The buffer 2010 may output the emphasis codes EPCODE, ENCODE as the auxiliary pull-up code PU5 and the auxiliary pull-down code PD5 so that the delay period changes in response to the operation mode change according to the PVT and frequency information, or may not output the auxiliary pull-up code PU5 and the auxiliary pull-down code PD5.

When the enable level data signal OUTPU and the auxiliary pull-up code PU5[N−1:0] are applied, the additional auxiliary pull-up driver circuit 2020 may output the 'high' level emphasis output data EMP_DATA' through the fifth node N5. Here, the fifth node N5 may be connected to the same pad as the first node N1 of FIG. 5.

When the enable level data signal OUTPD and the auxiliary pull-down code PD5[N−1:0] are applied, the additional auxiliary pull-down driver circuit 2030 may output the 'low' level emphasis output data EMP_DATA' through the fifth node N5.

Since the additional auxiliary pull-up driver circuit 2020 and the additional auxiliary pull-down driver circuit 2030 are the same as or similar to the auxiliary pull-up driver circuit 1720 and the auxiliary pull-down driver circuit 1730 described with reference to FIG. 17, a description thereof will be omitted.

Figure 21A:
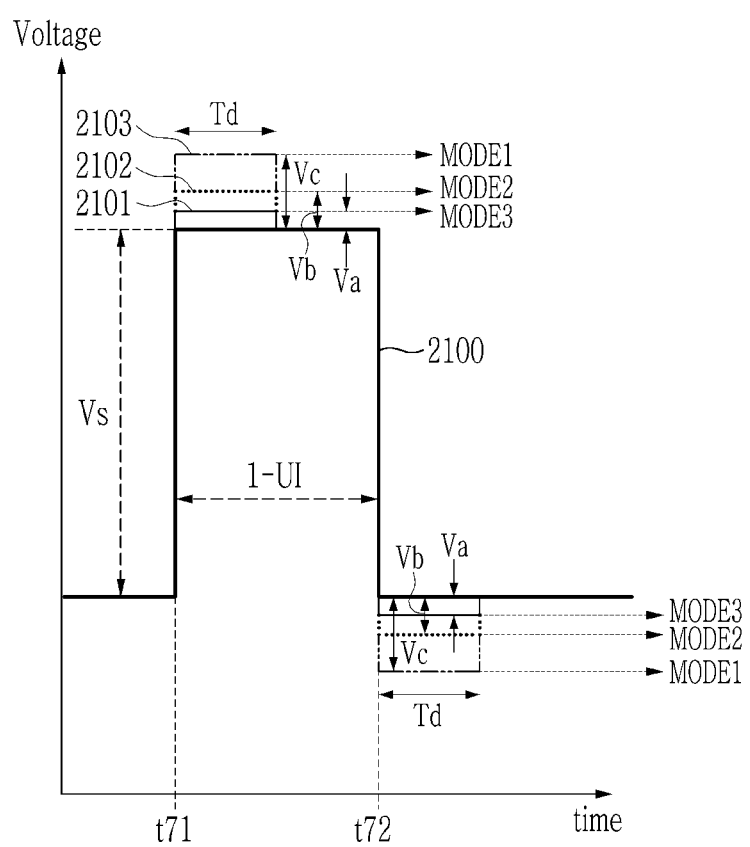
FIGS. 21A and 21B are graphs illustrating an output of a data output circuit according to an example embodiment.
Figure 21B:
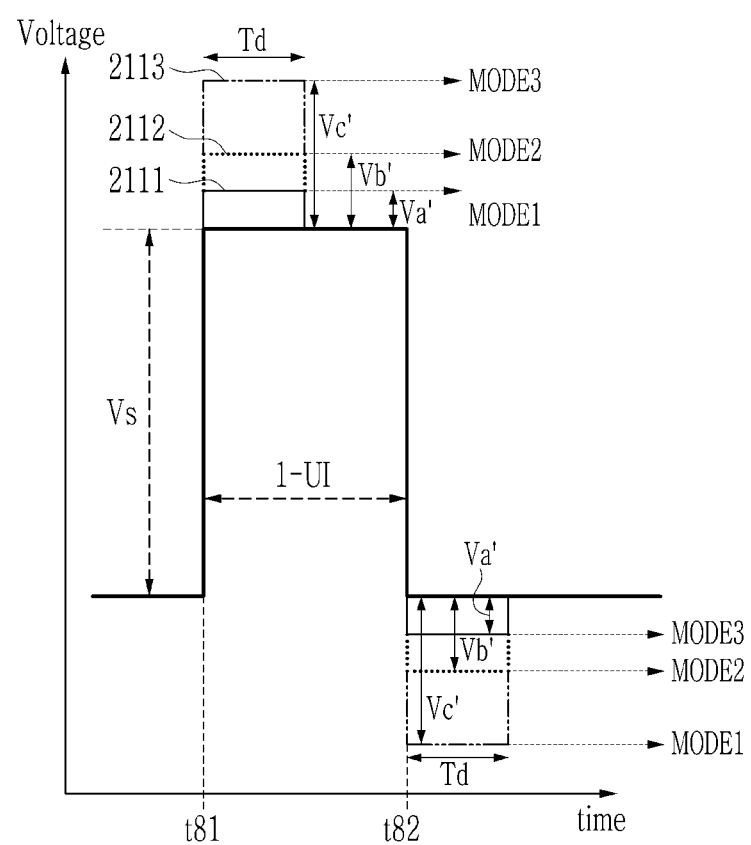

FIGS. 21A and 21B are graphs illustrating an output of a data output circuit according to an example embodiment.

FIG. 21A is a graph showing the waveform of the data signal when the additional auxiliary driver circuit does not operate, and FIG. 21B is a graph showing the waveform of the data signal when the additional auxiliary driver circuit operates.

Comparing the two graphs, at timings t71 and t81 at which the output signals 2100 and 2110 of the main driver circuit transition, in each of the same operation modes MODE1, MODE2, and MODE3, the magnitudes Va', Vb', and Vc' of the output signals 2111, 2112, and 2113 when the additional auxiliary driver circuit operates are greater than the magnitudes Va, Vb, and Vc of the output signals 2101, 2102, 2103 when the additional auxiliary driver circuit does not operate. For example, when the operating frequency exceeds a predetermined reference frequency, an additional auxiliary driver circuit may be used to further increase the driving strength of the pre-emphasis driving, thereby compensating for additional channel loss.

Figure 22:
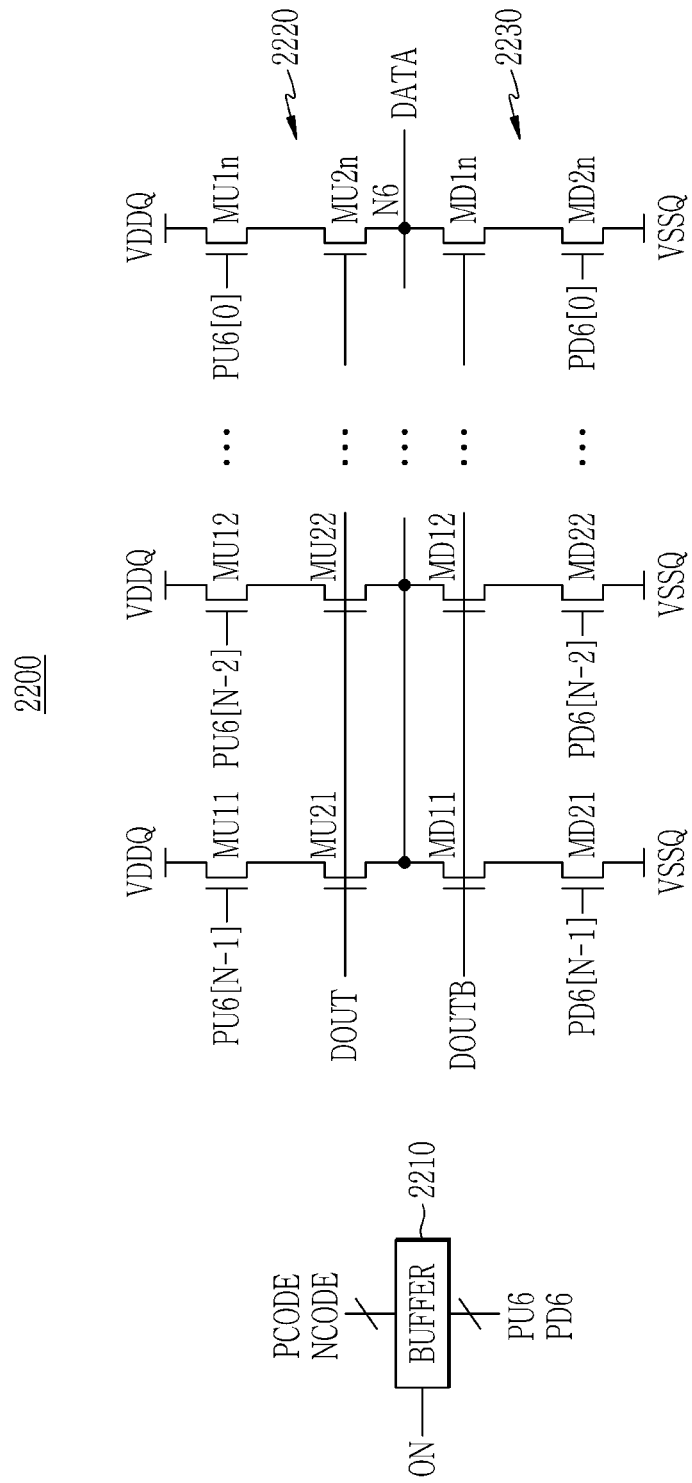
FIG. 22 is a circuit diagram schematically illustrating a main driver circuit according to an example embodiment.

FIG. 22 is a circuit diagram schematically illustrating a main driver circuit according to an example embodiment.

The main driver circuit 2200 may include a buffer 2210, a main pull-up driver circuit 2220, and a main pull-down driver circuit 2230. In FIG. 22, an example embodiment in which both the main pull-up driver circuit 2220 and the main pull-down driver circuit 2230 include an N-type transistor will be described. Among the descriptions of the main driver circuit 2200, the same or similar parts to the main driver circuit 500 described with reference to FIG. 5 will be omitted.

When the enable level data signal DOUT and the main pull-up code PU6[N−1:0] are applied, the main pull-up driver circuit 2220 may output data DATA of a 'high' level through the sixth node N6.

According to some example embodiments, in the main pull-up driver circuit 2220, a plurality of transistor pairs MU11 and MU21, MU12 and MU22, ..., MU1$n$ and MU2$n$ connected in series between the first power supply voltage VDDQ and the sixth node N6 may be connected in parallel. A voltage of a level corresponding to the corresponding bit value of the main pull-up code PU6[N−1:0] may be applied to the gates of the transistors MU11, MU12, ..., MU1$n$. The data signal DOUT may be applied to the gates of the transistors MU21, MU22, ..., MU2$n$.

When the enable level data signal DOUTB and the main pull-down code PD6[N−1:0] are applied, the main pull-down driver circuit 2230 may output 'low' level data DATA through the sixth node N6. According to some example embodiments, in the main pull-down driver circuit 2230, a plurality of transistor pairs MD11 and MD21, MD12 and MD22, ..., MD1$n$ and MD2$n$ connected in series between the second power supply voltage VSSQ and the sixth node N6 may be connected in parallel. A voltage having a level corresponding to the corresponding bit value of the main pull-down code PD6[N−1:0] may be applied to the gates of the transistors MD11, MD12, ..., MD1$n$. A data signal DOUTB may be applied to the gates of the transistors MD21, MD22, ..., MD2$n$.

Figure 23:
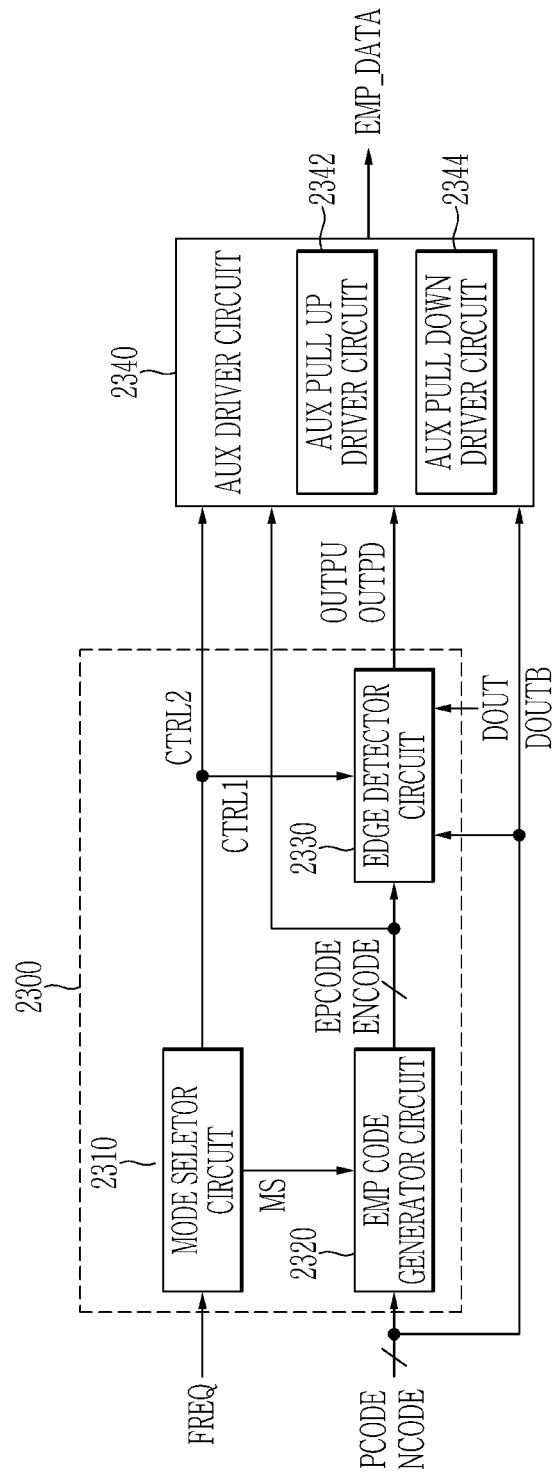
FIG. 23 is a block diagram illustrating an emphasis control circuit and an auxiliary driver circuit according to an example embodiment.

FIG. 23 is a block diagram illustrating an emphasis control circuit and an auxiliary driver circuit according to an example embodiment.

Referring to FIG. 23, the emphasis control circuit 2300 may include a mode selector circuit 2310, an emphasis code generator circuit 2320, and an edge detector circuit 2330. Here, descriptions of the mode selector circuit 2310 and the emphasis code generator circuit 2320 are omitted because they are the same as or similar to those of the mode selector circuit 1510 and the emphasis code generator circuit 1520 in FIG. 15.

The edge detector circuit 2330 may detect edges of the data DOUT and the data DOUTB. According to some example embodiments, the edge detector circuit 2330 may detect a rising edge of the data DOUT and output the emphasis data OUTPU having an enable level for a period corresponding to the emphasis code EPCODE or the calibration code PCODE from the rising edge. The edge detector circuit 2330 may detect a rising edge of the data DOUTB and output the emphasis data OUTPD having an enable level for a period corresponding to the emphasis code ENCODE or the calibration code NCODE from the rising edge. The edge detector circuit 2330 will be described with reference to FIG. 24.

Figure 24:
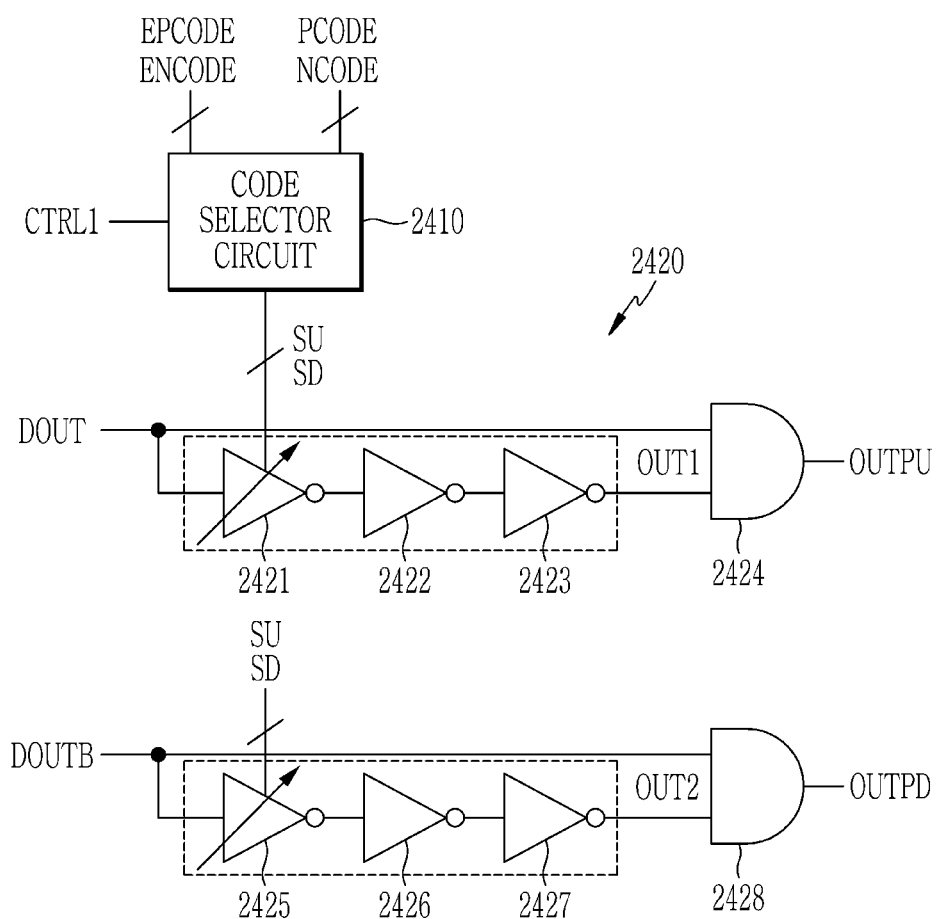
FIG. 24 is a diagram illustrating an edge detector circuit according to an example embodiment.

FIG. 24 is a diagram illustrating an edge detector circuit according to an example embodiment.

Referring to FIG. 24, the edge detector circuit 2400 may include a code selector circuit 2410 and an output signal generator circuit 2420. The code selector circuit 2410 may output the calibration codes PCODE and NCODE or the emphasis codes EPCODE and ENCODE as the switching codes SU and SD according to the control signal CTRL1. The code selector circuit 2410 may output the emphasis codes EPCODE, ENCODE as the switching codes SU, SD so that the delay period is changed in response to the operation mode change according to the PVT and frequency information, or output the calibration codes PCODE and NCODE as switching codes SU and SD so that the delay period is changed in response to the PVT.

The output signal generator circuit 2420 may output the delayed data signal OUTPU by performing an AND operation on the data signal DOUT and the data signal DOUT delayed by the switching codes SU and SD and the inverted signal OUT1. According to some example embodiments, the delayed data signal OUTPU has a "high" level when both the data signal DOUT and the signal OUT1 are at a high level, and has a "low" level otherwise.

The output signal generator circuit 2420 may output the delayed data signal OUTPD by performing an AND operation on the data signal DOUTB and the data signal DOUTB delayed by the switching codes SU and SD and the inverted signal OUT2. According to some example embodiments, the delayed data signal OUTPD has a "high" level when both the data signal DOUTB and the signal OUT2 are at a high level, and has a "low" level otherwise.

According to some example embodiments, the output signal generator circuit 2420 may include a plurality of inverters 2421, 2422, and 2423 and an AND gate circuit 2424 connected in series, and a plurality of inverters 2425, 2426, and 2427 and an AND gate circuit 2426 connected in series. The data signal DOUT may be input to one input terminal of the AND gate circuit 2424, and the signal OUT1 output from the inverter 2423 may be input to the other input terminal. The data signal DOUTB may be input to one input terminal of the AND gate circuit 2426, and the signal OUT2 output from the inverter 2427 may be input to the other input terminal.

Operations of the plurality of inverters 2421, 2422, 2423 and 2425, 2426, and 2427 are the same as or similar to those of the inverters 910, 920, and 930 of FIG. 9, and thus a description thereof will be omitted.

Figure 25:
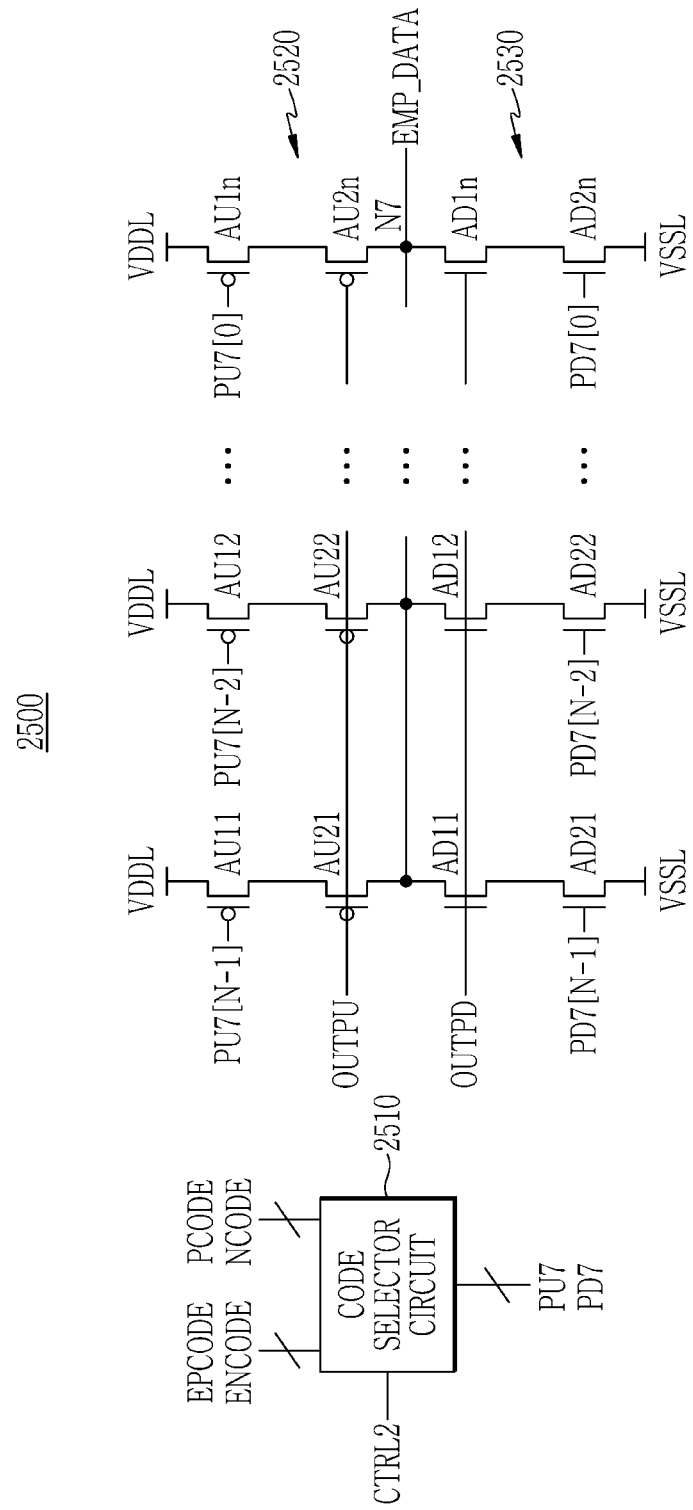
FIG. 25 is a circuit diagram schematically illustrating an auxiliary driver circuit according to an example embodiment.

FIG. 25 is a circuit diagram schematically illustrating an auxiliary driver circuit according to an example embodiment.

Referring to FIG. 25, the auxiliary driver circuit 2500 may include a code selector circuit 2510, an auxiliary pull-up driver circuit 2520, and an auxiliary pull-down driver circuit 2530. In FIG. 25, an example embodiment in which both the auxiliary pull-up driver circuit 2520 and the auxiliary pull-down driver circuit 2530 include an N-type transistor will be described.

Since the code selector circuit 2510 is the same as or similar to the code selector circuit 1710 described with reference to FIG. 17, a description thereof will be omitted.

With respect to the auxiliary pull-up driver circuit 2520 and the auxiliary pull-down driver circuit 2530, the same or similar parts to the description of the auxiliary pull-up driver circuit 1720 and the auxiliary pull-down driver circuit 1730 described with reference to FIG. 17 will be omitted.

When the enable level data signal OUTPU and the auxiliary pull-up code PU7[N−1:0] are applied, the auxiliary pull-up driver circuit 2520 may output the emphasis output data EMP_DATA of a 'high' level through the second node N2. Here, the seventh node N7 may be connected to the same pad as the sixth node N6 of FIG. 22. According to some example embodiments, in the auxiliary pull-up driver circuit 2520, a plurality of transistor pairs AU11 and AU21, AU12 and AU22, . . . , AU1$n$ and AU2$n$ connected in series between the third power supply voltage VDDL and the seventh node N7 are connected in parallel. A voltage of a level corresponding to the corresponding bit value of the auxiliary pull-up code PU7[N−1:0] may be applied to the gates of the transistors AU11, AU12, . . . , AU1$n$. The data signal OUTPU is applied to the gates of the transistors AU21, AU22, . . . , AU2$n$.

When the enable level data signal OUTPD and the auxiliary pull-down code PD7[N−1:0] are applied, the auxiliary pull-down driver circuit 2530 may output the 'low' level emphasis output data EMP_DATA through the seventh node N7. According to some example embodiments, in the auxiliary pull-down driver circuit 2530, a plurality of transistor pairs AD11 and AD21, AD12 and AD22, . . . , AD1$n$ and AD2$n$ connected in series between the fourth power voltage VSSL and the seventh node N7 may be connected in parallel. A voltage of a level corresponding to the corresponding bit value of the auxiliary pull-down code PD7[N−1:0] may be applied to the gates of the transistors AD11, AD12, . . . , AD1$n$. The data signal OUTPD may be applied to the gates of the transistors AD21, AD22, . . . , AD2$n$.

Figure 26:
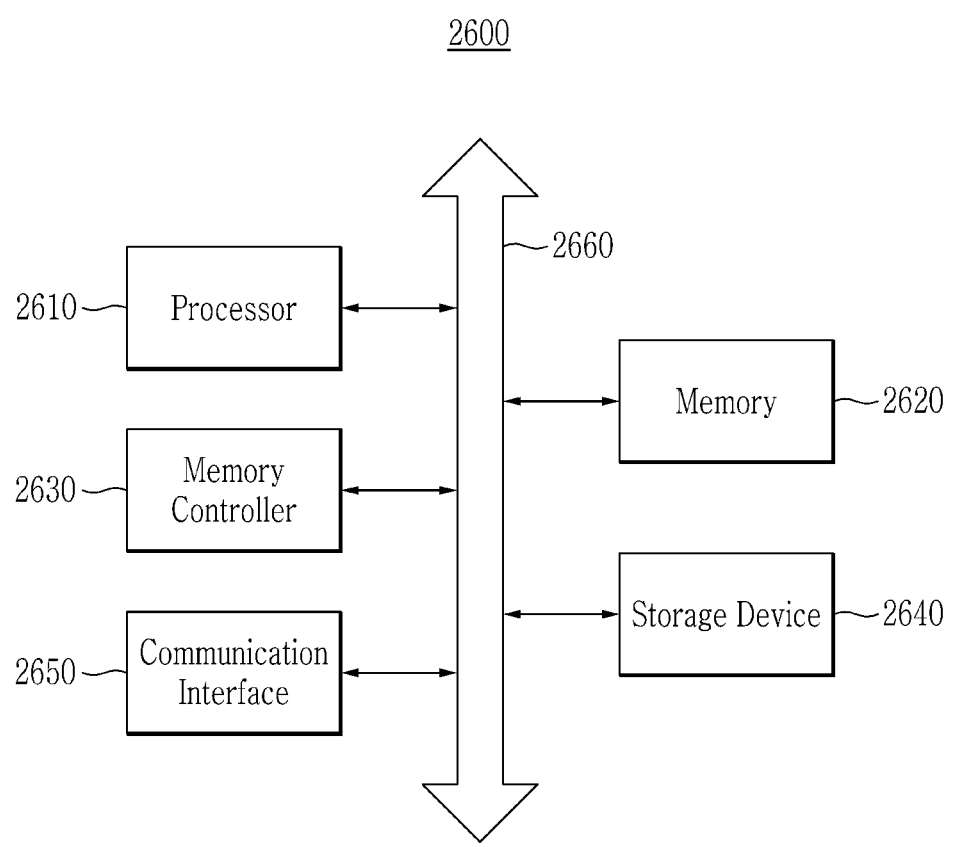
FIG. 26 is an example block diagram illustrating a computer system according to an example embodiment.

FIG. 26 is an example block diagram illustrating a computer system according to an example embodiment.

Referring to FIG. 26, a computing system 2600 includes a processor 2610, a memory 2620, a memory controller 2630, a storage device 2640, a communication interface 2650, and a bus 2660. Computing system 2600 may further include other general purpose components.

The processor 2610 controls the overall operation of each component of the computing system 2600. The processor 2610 may be implemented as at least one of various processing units such as a central processing unit (CPU), an application processor (AP), and a graphic processing unit (GPU).

The memory 2620 stores various data and commands. The memory 2620 may be implemented as the memory device described with reference to FIGS. 1 to 25. The memory controller 2630 controls the transfer of data or commands to and from the memory 2620. The memory controller 2630 may be implemented as the memory controller described with reference to FIGS. 1 to 25. According to some example embodiments, the memory controller 2630 may be provided as a separate chip from the processor 2610. According to some example embodiments, the memory controller 2630 may be provided as an internal configuration of the processor 2610.

The storage device 2640 non-temporarily stores programs and data. According to some example embodiments, storage device 2640 may be implemented as a non-volatile memory. The communication interface 2650 supports wired/wireless Internet communication of the computing system 2600. Also, the communication interface 2650 may support various communication methods other than Internet communication. Bus 2660 provides communication functions between components of computing system 2600. The bus 2660 may include at least one type of bus according to a communication protocol between components.

According to some example embodiments, each constituent element or the combination of two or more constituent elements described with reference to FIG. 1 to FIG. 25 may be implemented as a digital circuit which may be a combination of hardware and software, a programmable or nonprogrammable logic device or array, a microprocessor, an application specific integrated circuit (ASIC), and the like.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A semiconductor device comprising:
a calibration code generator circuit configured to generate a calibration code according to changes in external conditions;
a first driver circuit configured to output a data signal with an impedance value based on the calibration code;
an emphasis control circuit configured to:
generate an emphasis data signal based on the data signal, and
generate an emphasis code by level-shifting the calibration code by a number of bits based on an operating frequency, wherein a number of bits by which the calibration code is level-shifted based on a first operating frequency is higher than a number of bits by which the calibration code is level-shifted based on a second operating frequency which is higher than the first operating frequency; and
a second driver circuit configured to output the emphasis data signal with an impedance value generated based on the emphasis code.

2. The semiconductor device of claim 1, wherein the emphasis code generated according to the first operating frequency has a smaller value than the emphasis code generated according to the second operating frequency.

3. The semiconductor device of claim 1, wherein the number of bits level-shifted according to the first operating frequency is equal to or greater than the number of bits level-shifted according to the second operating frequency.

4. The semiconductor device of claim 1, wherein the emphasis data signal is generated by inverting the data signal and delaying the data signal by a period corresponding to the emphasis code.

5. The semiconductor device of claim 1, wherein the emphasis data signal comprises a first emphasis data signal and a second emphasis data signal, and
wherein the emphasis control circuit is configured to:
generate the first emphasis data signal to emphasize the data signal by a period corresponding to the emphasis code from a rising edge of the data signal, and
generate the second emphasis data signal to emphasize the data signal by a period corresponding to the emphasis code from a falling edge of the data signal.

6. The semiconductor device of claim 1, wherein the emphasis data signal is generated by inverting the data signal and delaying the data signal by a period corresponding to the calibration code.

7. The semiconductor device of claim 1, wherein the emphasis data signal comprises a first emphasis data signal and a second emphasis data signal, and
wherein the emphasis control circuit is configured to:
generate the first emphasis data signal to emphasize the data signal by a period corresponding to the calibration code from a rising edge of the data signal, and
generate the second emphasis data signal to emphasize the data signal by a period corresponding to the calibration code from a falling edge of the data signal.

8. The semiconductor device of claim 1, wherein the second driver circuit is configured to output the emphasis data signal with an impedance value adjusted by the calibration code under a control of the emphasis control circuit.

9. The semiconductor device of claim 1, further comprising a third driver circuit configured to output the emphasis data signal with an impedance value adjusted by the emphasis code,
wherein the emphasis control circuit is configured to control the third driver circuit to operate according to the operating frequency.

10. The semiconductor device of claim 1, wherein the emphasis control circuit is further configured to change the calibration code based on a change in the operating frequency of the semiconductor device.

11. The semiconductor device of claim 1, wherein the emphasis control circuit is further configured to change a delay period of the emphasis data signal based on the operating frequency of the semiconductor device.

12. The semiconductor device of claim 1, wherein the emphasis control circuit is further configured to:
generate a first emphasis code to output the emphasis data signal with a first delay based on the operating frequency of the semiconductor device having a first value, and
generate a second emphasis code to output the emphasis data signal with a second delay based on the operating frequency of the semiconductor device having a second value different from the first value.

13. A semiconductor device comprising:
a calibration code generator circuit configured to generate a calibration code according to changes in external conditions;
a first driver circuit configured to output a data signal with an impedance value based on the calibration code;
an emphasis control circuit configured to:
generate an emphasis data signal based on the data signal, and
generate an emphasis code by changing the calibration code based on an operating frequency; and
a second driver circuit configured to output the emphasis data signal with an impedance value generated based on the emphasis code,
wherein the emphasis code generated according to a first operating frequency has a smaller value than the emphasis code generated according to a second operating frequency greater than the first operating frequency, and
wherein the emphasis control circuit is configured to generate the emphasis code by level-shifting the calibration code by a number of bits based on the operating frequency.

* * * * *